United States Patent
Kong et al.

(10) Patent No.: US 11,257,989 B2
(45) Date of Patent: Feb. 22, 2022

(54) LIGHT EMITTING DEVICE PACKAGE AND LIGHT SOURCE DEVICE

(71) Applicant: SUZHOU LEKIN SEMICONDUCTOR CO., LTD., Taicang (CN)

(72) Inventors: Sung Min Kong, Seoul (KR); Ki Seok Kim, Seoul (KR); Young Shin Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 16/770,910

(22) PCT Filed: Dec. 6, 2018

(86) PCT No.: PCT/KR2018/015438
§ 371 (c)(1),
(2) Date: Jun. 8, 2020

(87) PCT Pub. No.: WO2019/112345
PCT Pub. Date: Jun. 13, 2019

(65) Prior Publication Data
US 2021/0175392 A1    Jun. 10, 2021

(30) Foreign Application Priority Data
Dec. 8, 2017    (KR) .................. 10-2017-0167897

(51) Int. Cl.
*H01L 33/48*      (2010.01)
*H01L 33/60*      (2010.01)

(52) U.S. Cl.
CPC ............ *H01L 33/486* (2013.01); *H01L 33/60* (2013.01)

(58) Field of Classification Search
CPC ..... H01L 33/486; H01L 33/60; H01L 25/167; H01L 2933/0091; H01L 33/54;
(Continued)

(56) References Cited

U.S. PATENT DOCUMENTS 10,199,545 B2 *   2/2019   Matsuura ............... H01L 33/486
2015/0028372 A1   1/2015   Nakanishi et al.
(Continued)

FOREIGN PATENT DOCUMENTS

KR    10-2013-0072152 A    7/2013
KR       10-1443870 B1    9/2014
(Continued)

*Primary Examiner* — Jonathan Han
(74) *Attorney, Agent, or Firm* — Birch, Stewart, Kolasch & Birch, LLP

(57) ABSTRACT

The light emitting device package disclosed in an embodiment of the invention includes first and second frames; a body disposed between the first and second frames; and a light emitting device disposed on the first and second frames, wherein the first frame includes a first end portion adjacent to the second frame, and the second frame includes a second end portion adjacent to the first frame and facing the first end portion, wherein the first end portion includes a first protruding portion protruding toward the second frame, and the second end portion includes a second protruding portion protruding toward the first frame. The light emitting device may include a first bonding portion disposed on the first protruding portion and a second bonding portion disposed on the second protruding portion.

19 Claims, 22 Drawing Sheets

(58) Field of Classification Search
CPC ............. H01L 33/62; H01L 33/48–486; H01L 2933/0033; H01L 33/56; H01L 33/502; H01L 33/50
See application file for complete search history.

(56) References Cited

U.S. PATENT DOCUMENTS

| | | | |
|---|---|---|---|
| 2016/0056356 A1* | 2/2016 | Oh | H01L 33/60 257/98 |
| 2016/0149103 A1 | 5/2016 | Oh et al. | |
| 2016/0190415 A1* | 6/2016 | Park | H01L 33/486 257/98 |
| 2017/0279015 A1* | 9/2017 | Ryu | H01L 33/647 |

FOREIGN PATENT DOCUMENTS

| | | |
|---|---|---|
| KR | 10-2015-0013066 A | 2/2015 |
| KR | 10-1557944 B1 | 10/2015 |
| KR | 10-2016-0005885 A | 1/2016 |
| KR | 10-2016-0057146 A | 5/2016 |
| KR | 10-2016-0079974 A | 7/2016 |

\* cited by examiner

LIGHT EMITTING DEVICE PACKAGE AND LIGHT SOURCE DEVICE

CROSS REFERENCE TO RELATED APPLICATIONS

This application is the National Phase of PCT International Application No. PCT/KR2018/015438, filed on Dec. 6, 2018, which claims priority under 35 U.S.C. 119(a) to Patent Application No. 10-2017-0167897, filed in the Republic of Korea on Dec. 8, 2017, all of which are hereby expressly incorporated by reference into the present application.

TECHNICAL FIELD

An embodiment of the invention relates to a light emitting device package and a light source device.

BACKGROUND ART

Light emitting devices such as Light Emitting Diode or Laser Diode using Group III-V or II-VI compound semiconductor materials have an advantage capable of realizing light of various wavelength bands such as red, green, blue, and ultraviolet light by development as thin film growth technology and device materials. As a light emitting device capable of providing a high output is requested, research is being conducted on a device capable of high output by applying high power. In addition, research is being conducted on a method of improving the light extraction efficiency of the light emitting device and improving the light intensity at the package stage. In addition, research is being conducted on a method of improving the bonding strength between the electrode of the light emitting device package and the light emitting device.

DISCLOSURE

Technical Problem

An embodiment of the invention provides a light emitting device package having a structure capable of giving elasticity in a first direction to a body disposed between frames. An embodiment of the invention provides a light emitting device package having a recess on the upper portion of the body disposed between the frames. An embodiment of the invention provides a light emitting device package having recesses at upper and lower portions of a body disposed between frames and a method of manufacturing the same.

An embodiment of the invention provides a light emitting device package having a spacer to prevent the flow of the light emitting device around the light emitting device and a method of manufacturing the same. An embodiment of the invention provides a light emitting device package by arranging a plurality of coupling holes inside each frame to suppress expansion of a metal frame. A light emitting device package may be provided a plurality of protrusions protruding from the body under the light emitting device.

Technical Solution

The light emitting device package according to an embodiment of the invention includes a first frame and a second frame spaced apart from each other; a body disposed between the first frame and the second frame; and a light emitting device disposed on the first frame and the second frame, wherein the first frame includes a first end portion adjacent to the second frame, and the second frame includes a second end portion adjacent to the first frame and facing the first end portion, the first end portion includes a first protruding portion protruding toward the second frame, and the second end portion includes a second protruding portion protruding toward the first frame, and the light emitting device may include a first bonding portion disposed on the first protruding portion and a second bonding portion disposed on the second protruding portion.

According to an embodiment of the invention, the body includes a first recess between the first and second frames, the first recess is overlapped with the light emitting device in a vertical direction and disposed under a region between the first and second bonding portions. According to an embodiment of the invention, the first end portion of the first frame includes third and fourth protruding portions spaced apart from both sides of the first protruding portion and protruding in a direction of the second frame, and the second end portions of the second of the second frames are spaced on both sides of the second protruding portion and include fifth and sixth protrusions protruding in a direction of the first frame. The body includes a first reflective portion disposed between the first and third protruding portions, a second reflective portion between the first and fourth protruding portions, a third reflective portion disposed between the second and fifth protruding portions, and a fourth reflective portion disposed between the second and sixth protruding portions.

According to an embodiment of the invention, a second recess may be disposed on the opposite side of the first recess under the body. According to an embodiment of the invention, the second resin may be disposed around the lower portion of the light emitting device and disposed around the first and second bonding portions. According to an embodiment of the invention, each of the first and second frames includes a plurality of holes disposed outside thereof, and a portion of the body may be coupled to the plurality of holes.

According to an embodiment of the invention, each of the first and second frames includes a coupling hole between the plurality of holes and the first and second protruding portions, and the coupling hole is disposed in a direction orthogonal to a direction in which the first and second frames are arranged. According to an embodiment of the invention, the coupling hole may include a stepped structure having a thickness smaller than the thickness of the first and second protruding portions. According to an embodiment of the invention, a plurality of coupling holes disposed in each frame are spaced apart from each other in a direction orthogonal to a direction in which the first and second frames are disposed, and each of the coupling holes may have a wider with than a width of each of the first and second protrusion portions.

According to an embodiment of the invention, a plurality of spacers is arranged around a lower surface of the light emitting device, and the plurality of spacers are spaced the first and second bonding portions of the light emitting device from the upper surfaces of the first and second frames. The upper surfaces of the plurality of spacers may protrude higher than the lower surfaces of the first and second bonding portions. The plurality of spacers may be disposed on both sides of the first and second protruding portions and protrude from the body. The first and second frames may have first and second support portions spaced apart than the width of the light emitting device and protruded from the body.

According to an embodiment of the invention, the depth of the first recess may have a range of 50% to 80% of a thickness of the first and second frames. According to an embodiment of the invention, the first and second bonding portions include a conductive layer disposed between the first and second frames, and the first and second resins may be disposed around the conductive layer disposed under the first and second bonding portions. Light source device according to an embodiment of the invention, a circuit board; and one or more light emitting device packages disclosed above on the circuit board.

Advantageous Effects

The invention may prevent defects due to temperature change in the center region of the package. The invention provides a cushioning structure to a body disposed on the center side of the package, thereby preventing cracking of the solder material around the body. The invention may provide a cushioning structure according to thermal deformation by forming recesses to at least one of the upper and lower portions of the body between the frames. The invention may improve light extraction efficiency and electrical properties and reliability. The invention may prevent the tilt of the light emitting device. In the invention, the light emitting device is adhered with a resin, so that the problem that the light emitting device is re-melted by external heat may be prevented. The invention may improve process efficiency and propose a new package structure to reduce manufacturing cost and improve manufacturing yield. The invention provides a body having a high reflectance, so that the reflective body may be prevented from discoloring, thereby improving the reliability of the semiconductor device package. The invention has an advantage of preventing a re-melting phenomenon from occurring in a bonding region of a semiconductor device package during the process of re-bonding the device package to a board.

BEST MODE

Figure 1:
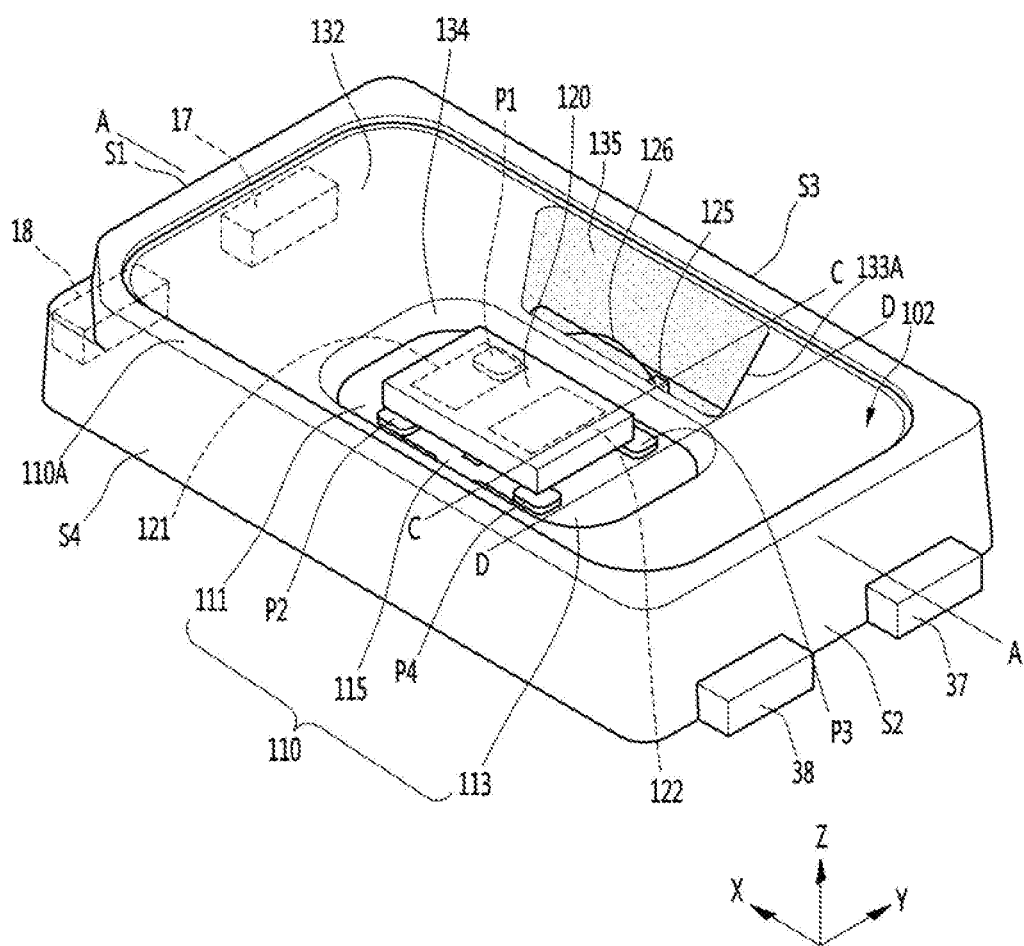
FIG. 1 is a perspective view of a light emitting device package according to a first embodiment of the invention.

An embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it may be "directly" or "indirectly" over the other substrate, layer (or film), region, pad, or pattern, or one or more intervening layers may also be present. Such a position of the layer has been described with reference to the drawings, but the embodiments are not limited thereto. A semiconductor device package according to an embodiment will be described in detail with reference to accompanying drawings. The device package in the invention may include a light emitting device emitting light such as ultraviolet, infrared, or visible light. Hereinafter, as an example of a semiconductor device, a case where a light emitting device is applied will be described, and a package or a light source device to which the light emitting device is applied may include a non-light emitting device such as a Zener diode or a sensing device for monitoring a wavelength or heat. Hereinafter, as an example of a semiconductor device, a case where a light emitting device is applied will be described, and a light emitting device package will be described in detail.

First Embodiment

FIGS. 1 to 9 are views showing a light emitting device package according to a first embodiment of the invention. Referring to FIGS. 1 to 9, the light emitting device package 100 may include a package body 110 and a light emitting device 120. The length X1 of the first direction X may be greater than the length Y1 of the second direction Y of the light emitting device package 100. The length X1 in the first direction may be greater than the length X2 in the first direction of the package body 110. The length X2 of the first direction X of the package body 110 may be longer than or equal to the length Y1 of the second direction Y. Here, the first direction may be a direction of a longer side among the sides of the light emitting device 120. For example, the first direction may be a long side direction of the light emitting device 120 and the second direction may be a short side direction. In the first direction, both short sides of the light emitting device 120 may be disposed on opposite sides, and in the second direction, both long sides of the light emitting device 120 may be disposed on opposite sides.

The package body 110 may include a plurality of frames and body 115. The plurality of frames may include, for example, a first frame 111 and a second frame 113, and may be spaced apart in the first direction X. The body 115 is disposed between the first and second frames 111 and 113 and is coupled to the first and second frames 111 and 113 and may function as an electrode separation line. The body 115 may provide a cavity 102 having side surfaces 132 inclined on the first and second frames 111 and 113. The package body 110 may be provided in a structure with a flat top surface without a cavity 102. The body 115 may include an upper body 110A having a cavity 102. The body 115 and the upper body 110A may be formed of the same material, or may be different materials, and may be formed integrally or separately from each other. For example, the body 115 may be a resin material or an insulating resin material. The body 115 may be formed of at least one selected from the group including PPA (Polyphthalamide), PCT (Polychloro Triphenyl), LCP (Liquid Crystal Polymer), PA9T (Polyamide9T), silicone, epoxy, EMC (Epoxy molding compound), SMC (Silicon molding compound), ceramic, PSG (photo sensitive glass), or sapphire (Al2O3). The body 115 may be formed of a resin material, and may include fillers of a high refractive material such as TiO2 and SiO2 therein. The body 115 may be formed of a thermoplastic resin, and the thermoplastic resin may be a material that softens when heated and softens when cooled. When the frames 111 and 113 and the materials in contact with them expand or contract due to heat, the body 115 made of a thermoplastic resin material may act as a buffer. When the body 115 serves as the buffer, it is possible to prevent a conductive layer such as a solder-based paste, an Ag-based paste, or a SAC (Sn—Ag—Cu)-based paste from being damaged. In the package, a coefficient of thermal expansion according to thermal expansion and contraction may have the first direction greater than the second direction. The body 115 may include a PCT or PPA material, and the PCT or PPA material has a high melting point and is a thermoplastic resin.

The inclined side surface 132 may have inclined side surfaces of the first and second directions at different angles. The inclined side surface 132 is inclined at a second angle θ2, and a lower portion 134 of the side surface of the cavity 102 is inclined at a first angle θ1 and faces the side surface of the light emitting device 120. For a horizontal straight line, the first angle θ1 may be greater than the second angle θ2. When the injection molding of the upper body 110A, the lower portion 134 of the side surface of the cavity 102 may be formed such that an abnormal structure such as a burr is not generated. For example, the first angle θ1 may be formed in a range of 45 degrees or more, for example, in a range of 45 degrees to 70 degrees. The height Z2 of the lower portion 134 of the side surface of the cavity 102 may be arranged in a range of 100 μm or more, for example, in a range of 100 to 200 μm.

Figure 4:
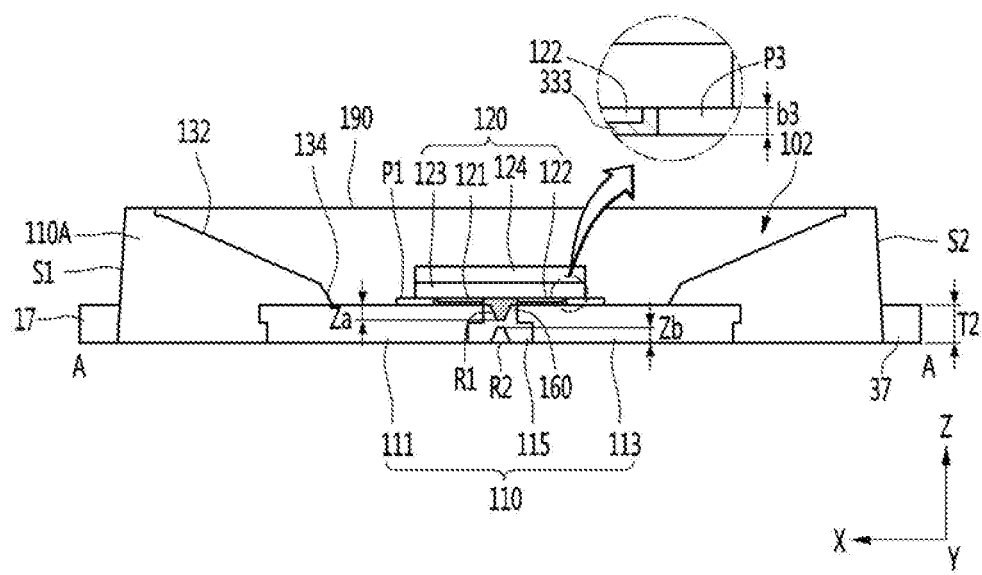
FIG. 4 is a cross-sectional view taken along A-A side of the light emitting device package of FIG. 1.

At least one region of the upper and lower portions of the body 115 disposed between the frames 111 and 113 may include a concave recess. The body 115 includes recesses R1 and R2, and may be buffered when the frame 111 and 113 and surrounding materials is thermally expanded or contracted. The lengths of the recesses R1 and R2 may be arranged in a direction orthogonal to the direction in which the thermal expansion or contraction is large. As shown in FIG. 4, the recesses R1 and R2 of the body 115 may include a first recess R1 at the upper portion and a second recess R2 at the lower portion. The recesses R1 and R2 of the body 115 may be implemented as a first recess R1 without the second recess. The recesses R1 and R2 of the body 115 are arranged in a long length in the second direction, thereby buffering thermal expansion or contraction along the first direction. Since the recesses R1 and R2 of the body 115 relieve thermal expansion or contraction in the first direction, generating of cracks in the frames 111 and 113 and the conductive layers 333 (see FIG. 6) bonded the frames 111 and 113 may be suppressed or prevented.

The first and second frames 111 and 113 may be provided as conductive or metal frames, the metal frames may be selected of, for example, copper (Cu), titanium (Ti), nickel (Ni), gold (Au), and chromium (Cr).), tantalum (Ta), platinum (Pt), tin (Sn), and silver (Ag), and may be formed in a single layer or multiple layers. The thickness T2 of the first and second frames 111 and 113 may be formed in a range of 100 μm or more, in a range of 100 to 300 μm, for heat dissipation properties and electrical conduction properties. The frames 111 and 113 include first and second metal layers, and the first metal layer is a base layer, and may include Cu, Ni, and Ti, and may be formed in a single layer or multiple layers. The second metal layer disposed on the first metal layer may include at least one of Au, Ni, and Ag layers, the Ni layer has a small change in thermal expansion, the Ag layer improves reflection efficiency, and the Au layer may improve bonding strength and improve reflection efficiency. As another example, the first and second frames 111 and 113 may be provided as a frame made of an insulating material. Hereinafter, for convenience of description, the first and second frames 111 and 113 will be described as metal frames.

Figure 3:
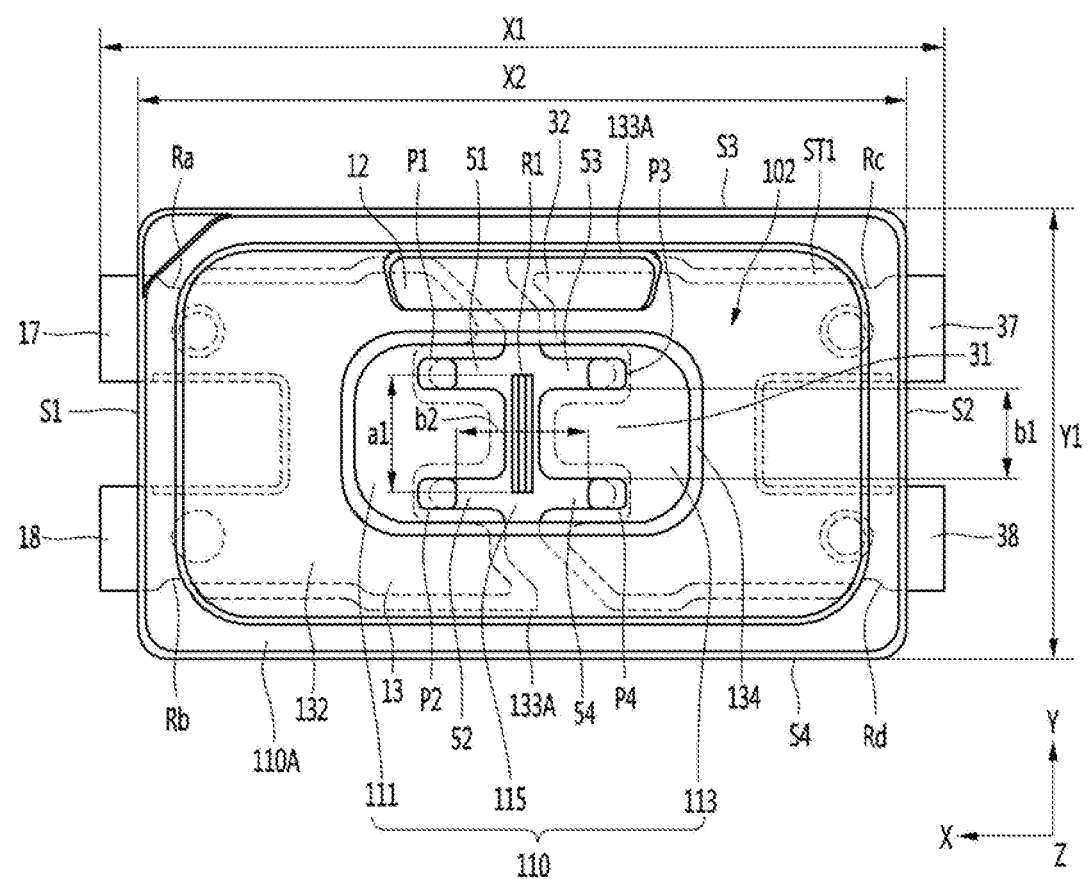
FIG. 3 is a plan view of the light emitting device package in FIG. 1.
Figure 9:
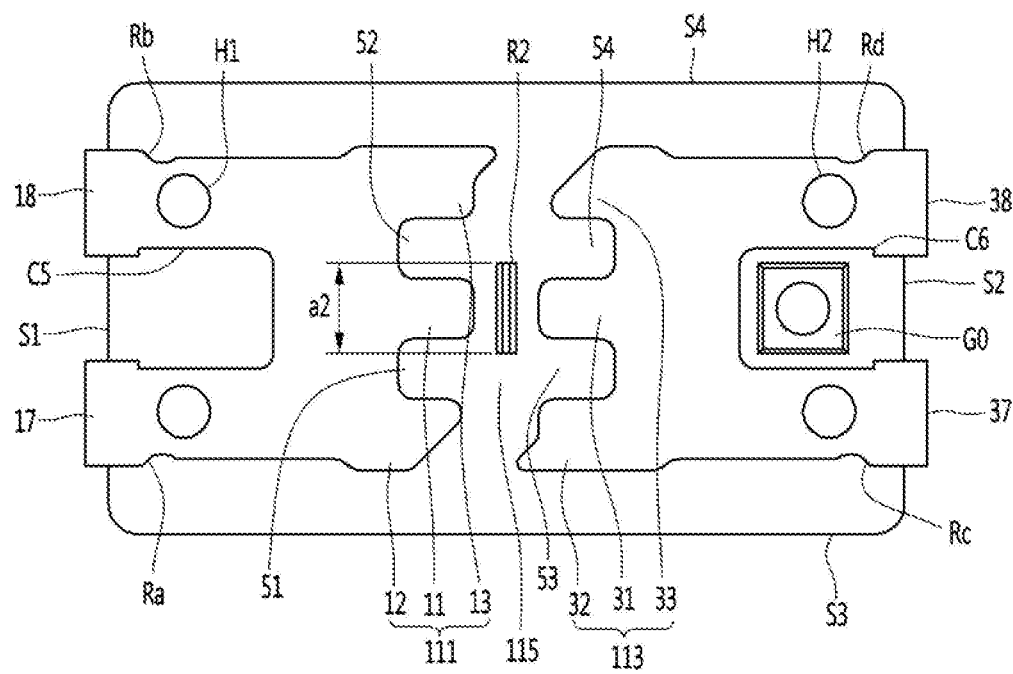
FIG. 9 is an example of a bottom view of the light emitting device package of FIG. 1.

The first extension portions 17 and 18 of the first frame 111 may extend in the direction of the first side surface S1 of the package body 110 and may protrude outward than the first side surface S1. The second extension portions 37 and 38 of the second frame 113 may extend in the direction of the second side surface S2 of the package body 110 and may protrude outside the second side surface S2. The first and second extension portions 17, 18, 37, and 38 may be disposed in one or a plurality, and in the case of a plurality of extension portions, the plurality of extension portions may be branched from each frame 111 and 113. In the package body 110, the first and second side surfaces S1 and S2 extend in the second direction and may be spaced apart in the first direction, and the third and fourth side surfaces S3 and S4 are extended in the first direction and may be spaced apart in the second direction. The first to fourth side surfaces S1, S2, S3, and S4 may be vertically or inclined with respect to a horizontal straight line. The first to fourth side surfaces S1, S2, S3, and S4 may be external side surfaces of the body 115. As shown in FIG. 9, a part of the body 115 may be disposed in an open region C5 between the first extension portions 17 and 18 of the first frame 111 and disposed in an open region C6 between the second extension portions 37 and 38 of the second frame 113. As shown in FIG. 3, a stepped structure may be disposed in the open regions C5 and C6. A concave structure G0 by an injection gate may be formed on a part of the bottom of the body 115.

A plurality of holes H1 and H2 may be disposed in the first and second extension portions 17, 18, 37 and 38, and the body 115 may be coupled through the holes H1 and H2. As shown in FIG. 3, the stepped structures ST1 and ST2 and the recesses Ra, Rb, Rc, and Rd may be disposed in the first and second frames 111 and 113 to strengthen the coupling with the body 115. The concave portions Ra, Rb, Rc, and Rd may be disposed at edge portions of the first and second extension portions 17, 18, 37, and 38. The concave portions Ra, Rb, Rc, and Rd, the stepped structures ST1 and ST2 and holes H1 and H2 may strengthen the bonding force between the frame 111 and 113 and the body 115 and suppress moisture penetration.

Figure 10:
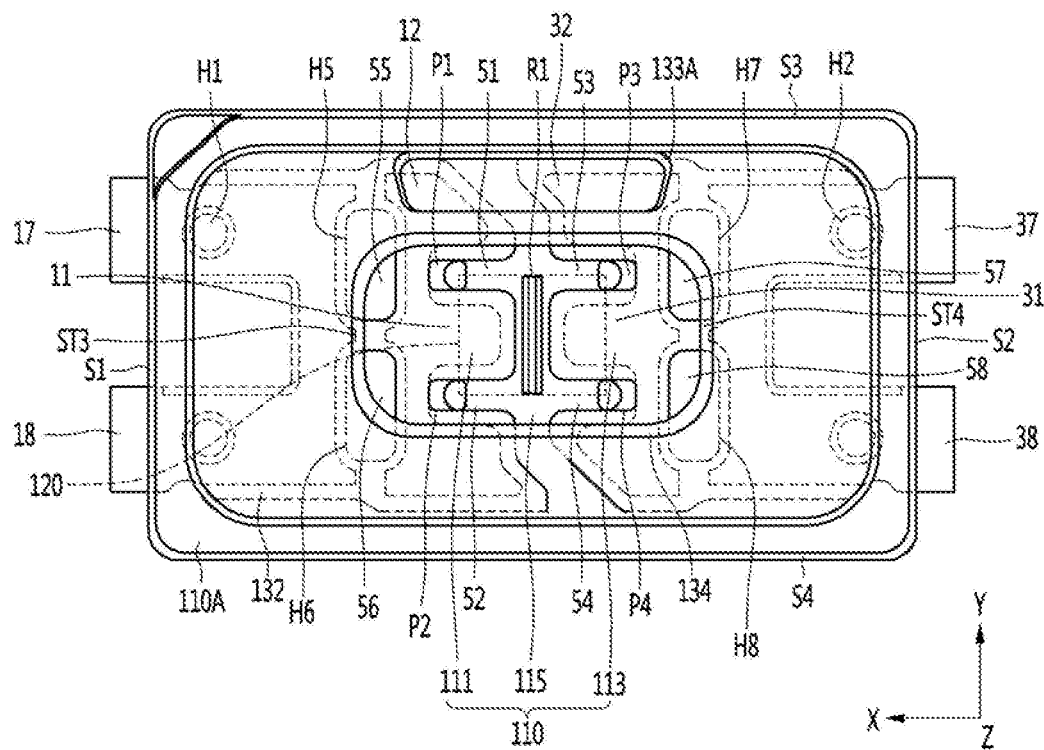
FIG. 10 is an example of a top view of a light emitting device package according to a second embodiment of the invention.

As shown in FIGS. 3 and 10, the first end portion of the first frame 111 is adjacent to the second frame 113 and extends toward the second frame 111 or extends in a direction of the second side surface S2 of the body 115. The first end portion of the first frame 111 may include a plurality of protruding portions, for example, three or more protruding portions. The first frame 111 includes a first protruding portion 11 in the center region between the third and fourth side surfaces S3 and S4, a second protruding portion 12 adjacent to the third side surface S3 of the body 115, and a third protruding portion 13 adjacent to the fourth side surface S4. The first protruding portion 11 may overlap the light emitting device 120 in a vertical direction or a third direction Z. Here, the third direction may be a direction orthogonal to the first and second directions, or a thickness direction of the package body. The first protruding portion 11 is disposed between the second protruding portion 12 and the third protruding portion 13, and the second protruding portion 12 is between the first protruding portion 11 and the third side surface S3. The third protruding portion 13 may be disposed between the first protrusion 11 and the fourth side surface S4. The lower surfaces of the first to third protruding portions 11, 12, and 13 may be exposed at the bottom of the body 115 and may overlap in the second direction. The outer portions of the second protruding portion 12 and the third protruding portion 13 may overlap the upper body 110A in a vertical direction or may be combined with the upper body 110A. The second end portion of the second frame 113 may face the first end portion and may be adjacent to the first frame 111. The second end portion of the second frame 113 may extend in the direction of the first frame 111 or protrude in the direction of the first side surface S1 of the body 115. The second end portion of the second frame 113 may include a plurality of protruding portions, for example, three or more protruding portions. The second end portion of the second frame 113 may include a fourth protruding portion 31 in the center region between the third and fourth side surfaces S3 and S4, a fifth protrusion portion 32 adjacent to the third side surface S3 of the body 115, and a sixth protruding portion 33 adjacent to the fourth side surface S4. The fourth protruding portion 31 may overlap the light emitting device 120 in the vertical direction or the third direction Z. Here, the third direction may be a direction orthogonal to the first and second directions, or a thickness direction of the package body. The fourth protruding portion 31 is disposed between the fifth protruding portion 32 and the sixth protruding portion 33, the fifth protruding portion 32 is between the fourth protruding portion 31 and the third side surface S3, and the sixth protruding portion 33 may be disposed between the fourth protruding portion 31 and the fourth side surface S4. The lower surfaces of the fourth to sixth protruding portions 31, 32, and 33 may be exposed at the bottom of the body 115, and may overlap in the second direction. The outer portions of the fifth protruding portion 32 and the sixth protruding portion 33 may overlap the upper body 110A in a vertical direction or may be combined with the upper body 110A. The second and fifth protruding portions 12 and 32 may be spaced apart from the third side surface S3, and the third and sixth protruding portions 13 and 33 may be spaced apart from the fourth side surface S4. The number of each of the first and fourth protruding portions 11 and 31 may be the same as the number of the light emitting devices 120. For example, when the number of the light emitting devices is one or two, the number of each of the first and fourth protruding portions may be one or two. Each protruding portion 11, 12, and 13 of the first frame 111 and each protruding portion 31, 32, and 33 of the second frame 113 are faced to each other, and the first and fourth protruding portions 11 and 31 are faced to each other, the second and fifth protruding portions 12 and 32 are faced to each other, and the third and sixth protruding portions 13 and 33 are faced to each other. The first recess R1 may overlap the first and fourth protruding portions 11 and 31 in the first direction. The first recess R1 may be disposed in regions that do not overlap the second and third protruding portions 12 and 13 and the fifth and sixth protruding portions 32 and 33 in the first direction. One end of the third protruding portion 13 protrudes further toward the second frame 113 than the first and second protruding portions 11 and 12, and one end of the fifth protruding portion 32 may further protruded toward the first frame 111 than the fourth and sixth protrusion portions 31 and 33.

Figure 2:
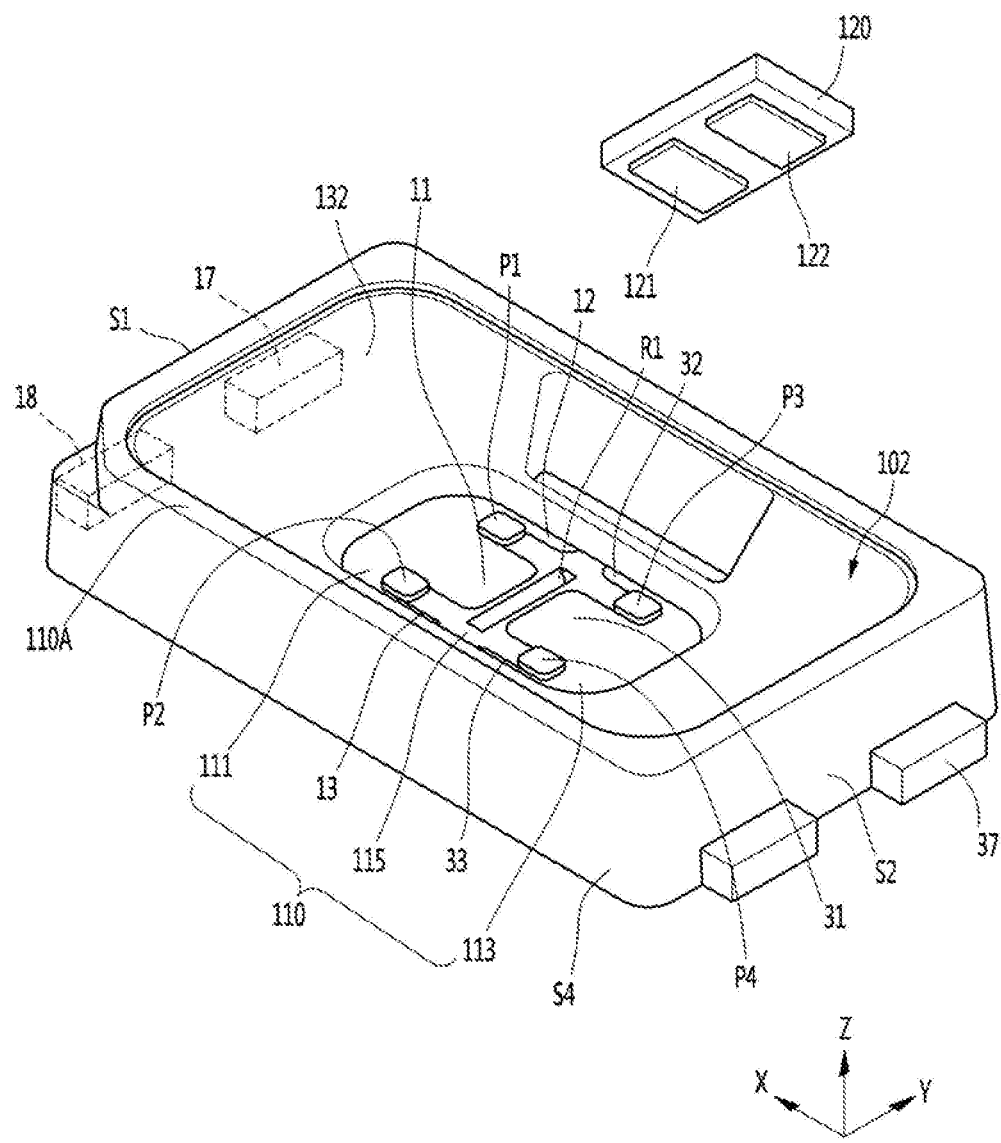
FIG. 2 is an exploded perspective view of a light emitting device of the light emitting device package in FIG. 1.
Figure 6:
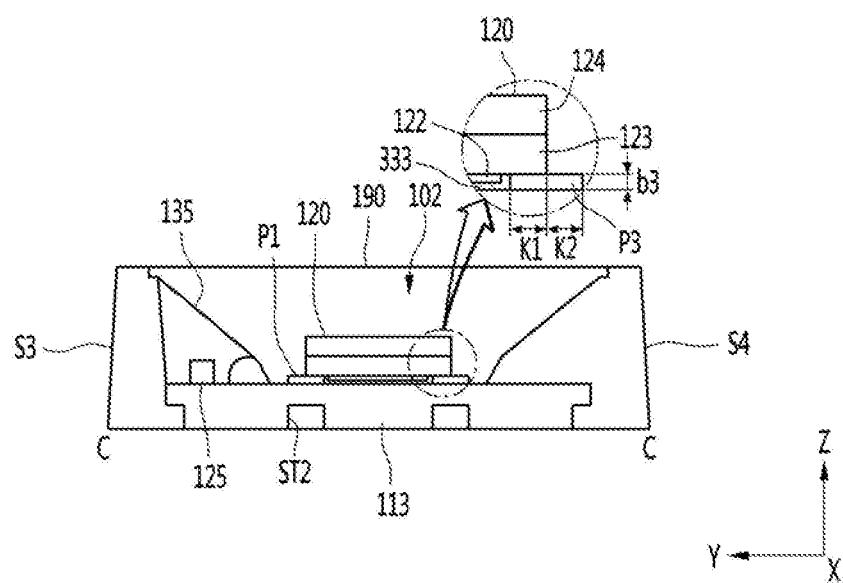
FIG. 6 is a cross-sectional view taken along C-C side of the light emitting device package of FIG. 1.
Figure 7:
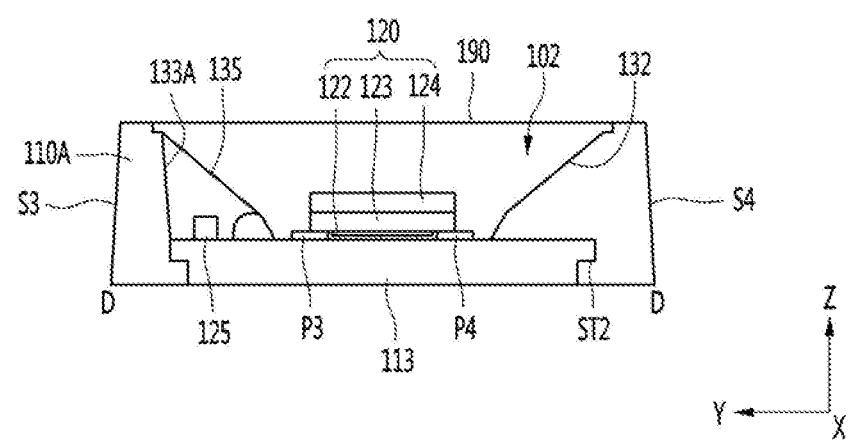
FIG. 7 is a cross-sectional view taken along D-D side of the light emitting device package of FIG. 1.

As shown in FIG. 2, a lower portion of the light emitting device 120 may be provided with first and second bonding portions 121 and 122. The first and second bonding portions 121 and 122 may be spaced apart in the same direction as the first and second frames 111 and 113, that is, in the first direction. The first protruding portion 11 may face or oppose to the first bonding portion 121 of the light emitting device 120, and the fourth protruding portion 31 may face or oppose to the second bonding portion 122 of the light emitting device 120. As shown in FIGS. 4 and 6, the first protruding portion 11 and the first bonding portion 121, and the fourth protruding portion 31 and the second bonding portion 122 are bonded by a conductive layer 333 and may be electrically connected to each other. The conductive layer 333 may be adhered between the first frame 111 and the first bonding portion 121 and between the second frame 113 and the second bonding portion 122. Since the conductive layer 333 is liquid during the bonding process, it may be diffused by the pressure applied from the light emitting device 120, and the thickness of the conductive layer 333 may be thinner or non-uniform due to the diffusion phenomenon of the conductive layer 333. In an embodiment, a resin material may be further disposed around the conductive layer 333 to suppress diffusion of the conductive layer 333. Accordingly, the conductive layer 333 may be adhered to a uniform and thick thickness in the region between the first frame 111 and the first bonding portion 121 and between the second frame 113 and the second bonding portion 122.

As shown in FIG. 3, the first and fourth protruding portions 11 and 31 may be exposed at the center of the bottom of the cavity 102. The inner regions of the second and third protruding portions 12 and 13 and the inner regions of the fifth and sixth protruding portions 32 and 33 may be exposed on both sides of the bottom of the cavity 102. The area of the upper surface of the first or fourth protruding portions 11 and 31 may be larger than the area of the upper surface of the second and third protruding portions 12 and 13 or the area of the upper surfaces of the fifth and sixth protruding portions 32 and 33. As another example, the inner regions of the fifth and sixth protruding portions 32 and 33 may not be exposed on both sides of the bottom of the cavity 102.

The length a1 in the second direction of the first recess R1 may be longer than the length b1 in the second direction of the first and fourth protruding portions 11 and 31. When the thermal expansion or contraction by the first and fourth protruding portions 11 and 31, the first recess R1 of the body 115 and/or the second recess R2 of the lower portion may be buffered in a wider region, it is possible to alleviate the impact transmitted to the conductive layer 333. The lengths of the first and second bonding portions 121 and 122 of the light emitting device 120 in the second direction may be equal to or less than the lengths of the first and fourth protruding portions 11 and 31 in the second direction. The length a1 in the second direction of the first recess R1 may be longer than the lengths in the second direction of the first and second bonding portions 121 and 122 of the light emitting device 120, so that the heat shock transferred from the first and second bonding portions 121 and 122 may be buffered. The length a1 in the second direction of the first recess R1 may be equal to or smaller than the length in the second direction of the light emitting device 120, and may be in the range of 650 µm or more, for example, in a range of 650 to 900 µm. When the length a1 is smaller than the above range, the length of the first and fourth protruding portions 11 and 31 becomes smaller than the length in the second direction, so that a buffering action against thermal deformation may be insignificant, and when the length a1 is greater than the above range, the stiffness of the center side of the body 115 may be degraded and light loss may be increased. The length a1 of the first recess R1 in the second direction is greater than the length of the first and fourth protruding portions 11 and 31 in the second direction, and may be less than the length of the bottom of the cavity 102 in the second direction. The length a1 may be 50% or more and less than 100% of the length of the light emitting device 120 in the second direction or may be the same as a short side length or the length of the light emitting device 120 in the second direction. As another example, for example, the length a1 may be arranged in a range of ±50 µm based on the length of the light emitting device 120 in the second direction. Since the length a1 is disposed larger than the length b1 in the second direction of the first and fourth protruding portions 11 and 31, it is possible to alleviate thermal deformation transmitted to the body 115, thereby the cracks in solder and the cracks in the body may be suppressed.

In the first recess R1, the upper width a0 in the first direction may be wider than the lower width. The first recess R1 may have a gradually narrower width from the upper portion to the lower portion. The first recess R1 may have an inner surface having a polygonal shape such as a triangle or a square, or a hemispherical shape. The upper width a0 of the first recess R1 may be 100 µm or more, for example, in a range of 100 to 150 µm. The upper width a0 of the first recess R1 is smaller than the distance between the first and second frames 111 and 113 in the first direction, or may be smaller than a distance between the upper surfaces of the first and fourth protruding portions 11 and 31.

Figure 5:
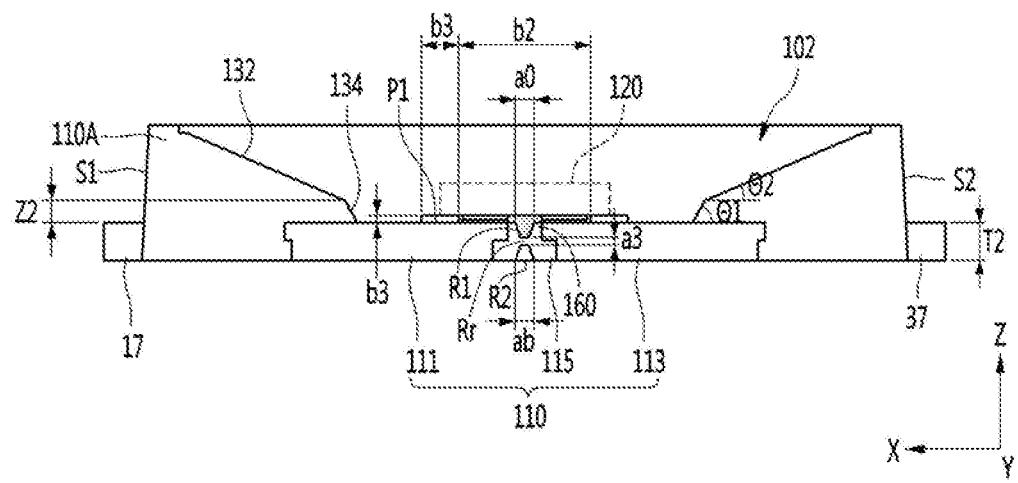
FIG. 5 is a detailed view of FIG. 4 without a light emitting device.

As shown in FIGS. 4 and 5, the depth Za of the first recess R1 may be smaller than the thickness T2 of the first and second frames 111 and 113, and may be smaller than the thickness T2 of the body 115. Here, when only the upper recess is disposed in the first recess R1, the depth Zc of the first recess R1 may be 50% or more of the thickness T2 of the frames 111 and 113, for example, in a range of 50% To 80%. The depth Zc of the first recess R1 may be 125 µm or more, for example, in the range of 125 to 200 µm. By the depth Zc of the first recess R1, the cracks in the solder due to thermal deformation of the body 115 may be suppressed and the cracks in lower portion of the body 115 between the frames 111 and 113 may be prevented. When the first recess R1 is smaller than the depth Zc, the buffering role may be negligible, and when it is larger than the above range, the breaking strength of the center side of the body may be lowered. The lower width ab of the second recess R2 may be the same as or greater than the upper width a0 of the first recess R1. Here, the lower width of the body 115 disposed between the first and second frames 111 and 113 may be wider than the upper width.

As shown in FIG. 9, the length a2 in the second direction of the second recess R2 may be equal to or less than the length a1 in the second direction of the first recess R1 (a1 in FIG. 3). Accordingly, as shown in FIG. 3, the lower recess may be not extended to a part of the first and second reflective portions 51 and 52 extended from the body 115 and a part of the third and fourth reflective portions 53 and 54 extended from the body 115.

As another example, as shown in FIGS. 4 and 5, when the first recess R1 is disposed on an upper portion of the body 115 and the second recess R2 is disposed on the lower portion of the body, a depth Za the first recess R1 may be 25% or more, for example, in a range of 25% to 50% of the thickness T2 of the first and second frames 111 and 113. The depth Zb of the second recess R2 of the lower portion may be 25% or more, for example, in a range of 25% to 50% of the thickness T2 of the first and second frames 111 and 113. The depth Za of the first recess R1 may be 60 µm or more, for example, in a range of 60 to 125 µm. The depths Za and Zb of the first and second recesses R1 and R2 may be the same or different from each other. The depth Za of the first recess R1 may be disposed deeper than the depth Zb of the second recess R2, or the depth Zb of the second recess R2 may be disposed deeper than the depth Za of the first recess R1. The body 115 may be disposed only in the upper portion or in the lower portion, or may be disposed in both the upper and lower portions. When one recess is disposed on the upper or lower portion of the body 115, the depth of the recess may be disposed deeper than a depth of recesses on both the upper and lower portions.

Figure 11:
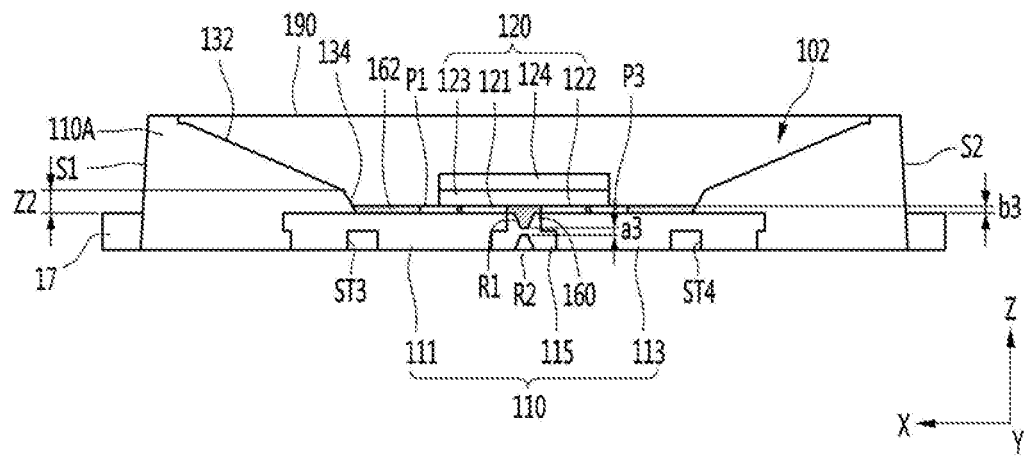
FIG. 11 is an example of a side cross-sectional view of the light emitting device package of FIG. 10.
Figure 12:
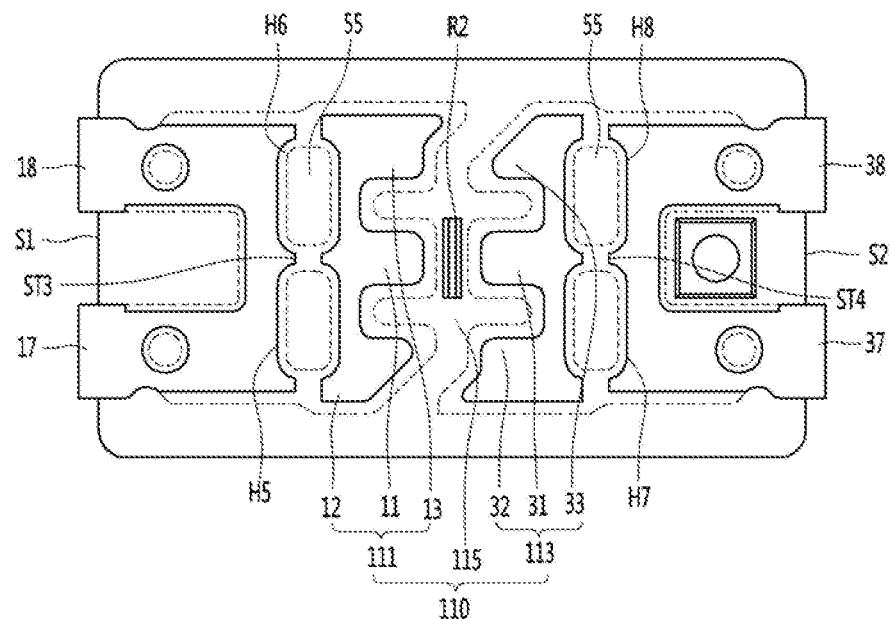
FIG. 12 is a bottom view of the light emitting device package of FIG. 10.
Figure 21:
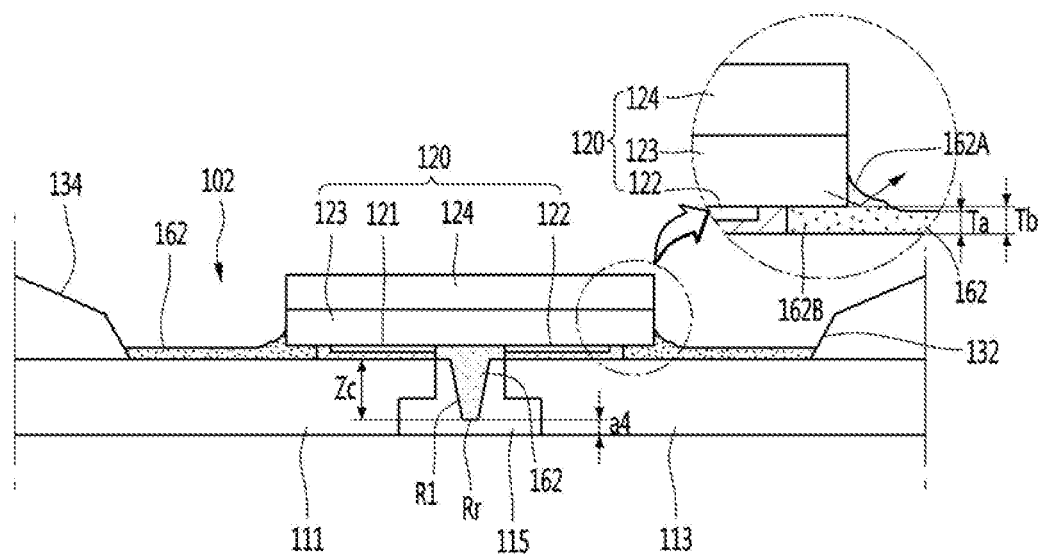
FIG. 21 is an example of a partial side sectional view for explaining a light emitting device and a second resin in FIG. 17.
Figure 22:
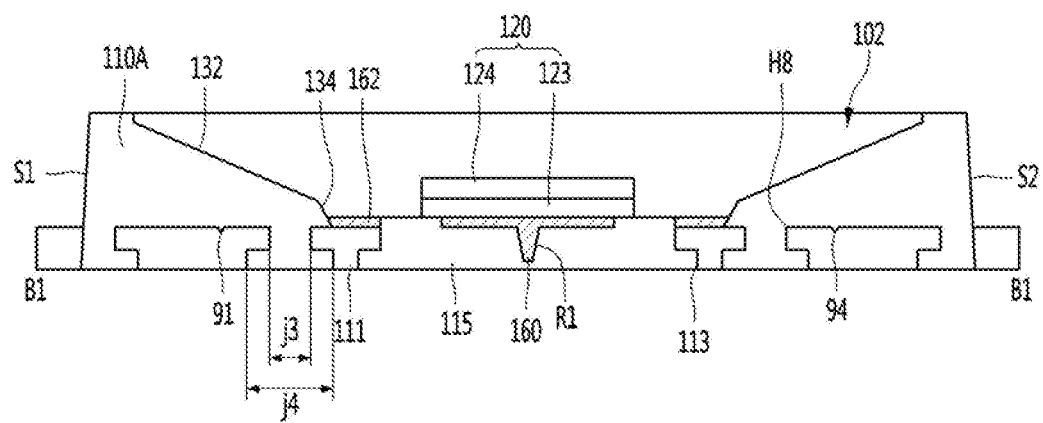
FIG. 22 is a cross-sectional view taken along B1-B1 side of the light emitting device package of FIG. 17.
Figure 23:
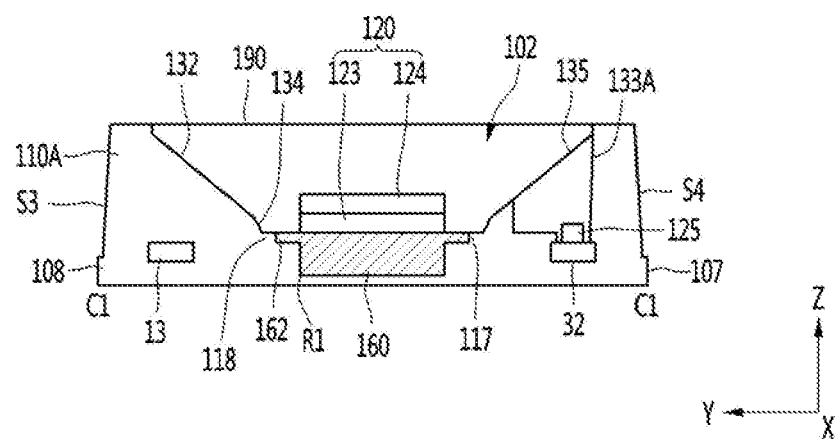
FIG. 23 is a cross-sectional view taken along C1-C1 side of the light emitting device package of FIG. 17.
Figure 24:
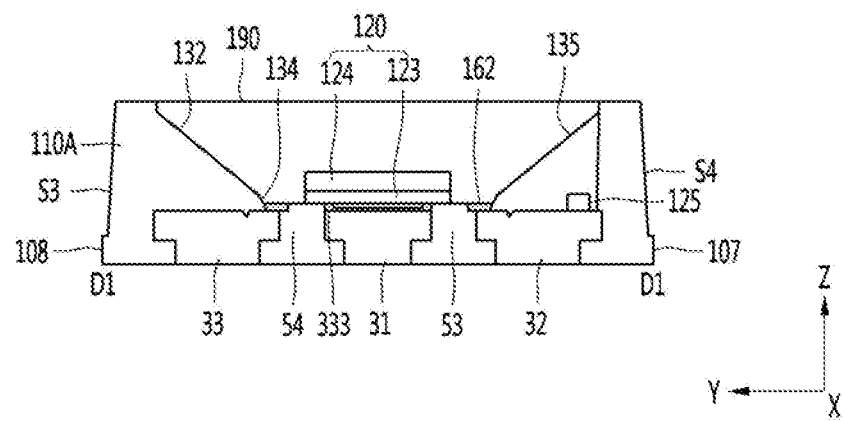
FIG. 24 is a cross-sectional view taken along D1-D1 side of the light emitting device package of FIG. 17.

The body 115 having the recess has a minimum thickness a3 and a4 of the connecting portion Rr disposed between the two frames 111 and 113, as shown in FIG. 5, and is connected to each other to support the two frames 111 and 113, and may prevent the stiffness deterioration of the center side of the body. The connecting portion of the body 115 may overlap with at least one of the first recess R1 and the second recess R2 in the vertical direction. Here, as shown in FIGS. 11 and 21, in a structure in which one the first recesses R1 are formed or a structure in which the first and second recesses R1 and R2 are arranged on both sides, the minimum thickness a3 and a4 of the connecting portion Rr of the body 115 of may be 45 µm or more, for example, in the range of 45 to 55 µm. The minimum thicknesses a3 and a4 of the connection part Rr of the body 115 may be 0.25 or less, for example, in the range of 0.15 to 0.25, based on the thickness T2 of the first and second frames 111 and 113. The minimum thicknesses a3 and a4 of the connection part Rr may be 55 µm or less, for example, in the range of 45 to 55 µm. The connection portion Rr of the body 115 may have the minimum thickness a3 and a4, when thermal deformation occurs by the first and second frames 111 and 113, the body 115 may be supported and buffered due to the minimum thickness a3 and a4. In this case, the body 114 may be softened or hardened and buffered according to a temperature change in which the body 115 is a thermoplastic resin, thereby preventing a problem that the connection part Rr is damaged. According to an embodiment of the invention, the above-described problem may be solved by using a structure in which the thickness of the conductive layer 333 is secured and the thermal deformation of the body is relaxed. An embodiment of the invention is disposed between the first frame 111 and the second frame 113 to reduce the volume of the body 115 located in a region overlapped with the light emitting device 120 in the vertical direction, when the thermal deformation by the first and second frames 111 and 113 occurs, the body 115 may be buffered.

The body 115 may include a reflective portion disposed between the protruding portions 11, 12 and 13 of the first frame 111 and the protruding portions 31, 32 and 33 of the second frame 113. As shown in FIG. 3, the body 115 includes a first reflective portion 51 extending into a region between the first protruding portion 11 and the second protruding portion 12, and a second reflective portion 52 extending into a region between the first and third protruding portions 11 and 13, a third reflective portion 53 extending to the region between the fourth and fifth protruding portions 31 and 32, and a fourth reflective portion 54 extending into the region between fourth and sixth protruding portion 31 and 33. The first to fourth reflective portions 51, 52, 53, and 54 may be coupled with a stepped structure disposed outside the first to sixth protruding portions 11, 12, 13, 31, 32, and 33. The concave portions of the frames 111 and 113 to which the first to fourth reflective portions 51, 52, 53, and 54 are coupled have a curved or round shape, and are coupled with the reflective portions 51, 52, 53, and 54, thereby increasing the contact area to suppress the moisture penetration. The first and third reflective portions 51 and 53 are disposed in a first direction and may be extended in opposite directions to each other, and the second and fourth reflective portions 52 and 54 are disposed in a first direction and may be extended in opposite directions to each other. The first protruding portion 11 may be disposed between the first and second reflective portions 51 and 52, and the fourth protruding portion 31 may be disposed between the third and fourth reflective portions 53 and 54. The first to fourth reflective portions 51, 52, 53, and 54 may be disposed apart from the lower portion 132 of a side of the cavity 102. The first to fourth reflective portions 51, 52, 53, and 54 are further disposed on the bottom of the cavity 102, thereby improving light reflectivity. As shown in FIGS. 4 to 7, each of the reflective portions 51, 52, 53, and 54 may overlap the light emitting device 120 in the vertical direction or the third direction at the bottom of the cavity 102. Each of the reflective portions 51, 52, 53, and 54 may reflect light traveling in a lateral direction or a downward direction from the light emitting device 120. Each of the reflective portions 51, 52, 53, and 54 is formed of the same resin material as the body 115 and is disposed on a dispersed region, so that the conductive layer may be prevented from being moved toward the reflective portions 51, 52, 53, and 54. The conductive layer may include a conductive paste, for example, a solder paste, Ag paste, or SAC (Sn—Ag—Cu) series. By preventing the reflective portions 51, 52, 53, and 54 from passing over a material such as a conductive paste, the region between the light emitting device 120 and the frames 111 and 113 may improve adhesion by the conductive layer 333. Each of the reflective portions 51, 52, 53, and 54 may suppress flow or spread of the conductive layer 333 during the bonding process.

Spacers P1, P2, P3, and P4 may space the light emitting device 120 from the upper surfaces of the frames 111 and 113. The spacers P1, P2, P3, and P4 may be disposed on the lower edge of the light emitting device 120, or may overlap the lower edge in a vertical direction. The spacers P1, P2, P3, and P4 may be materials constituting the body 115 or may be made of the same material as the body 115. As another example, the spacers P1, P2, P3, and P4 may be formed of the same material as the frames 111 and 113 or other materials constituting the frames 111 and 113. The spacers P1, P2, P3, and P4 may be 3 or more or 4 or more. The spacers P1, P2, P3, and P4 provide an distance between the light emitting device 120 and the upper surfaces of the frames 111 and 113, and in the manufacturing process, the spacers may prevent the light emitting device 120 from being tilted by a liquid conductive layer disposed between the bonding portions 121 and 122 of the light emitting device 120 and the upper surfaces of the frames 111 and 113. The spacers P1, P2, P3, and P4 are disposed outside the first and fourth protruding portions 11 and 31, so that the conductive layer 333 may be reduced to spread by the pressure pressed from the light emitting device 120. Spaces between the light emitting devices 120 and the frames 1111 and 113 are secured by the spacers P1, P2, P3, and P4, so that the space disposing the conductive layer 333 or a thickness of the conductive layer 333 may be secured. Accordingly, the thickness of the conductive layer 333 disposed under the light emitting device 120 is increased, so that the crack of the conductive layer 333 may be prevented, and a decreasing of electrical reliability may be prevented. The diffusion path of the conductive layer 333 may be limited by the body 115 and the reflective portions 51, 52, 53, and 54 serving as a dam around the conductive layer 333, and it may be reduced the problem due to the spread of the conductive layer 333. The spacers P1, P2, P3, and P4 may provide a space to facilitate the under-fill process by separating the light emitting device 120 from the upper surface of the frame.

The spacers P1, P2, P3, and P4 include first and second spacers P1 and P2 disposed on the first frame 111, and third and fourth spacers P3 and P4 disposed on the second frame 113. The first and second spacers P1 and P2 are disposed on both sides of the first protruding portion 11 in the second direction, and the third and fourth spacers P3 and P4 may be disposed on both sides of the fourth protruding portion 31 in the second direction. The first spacer P1 may extend on the first reflective portion 51 in a direction of the first side surface and overlap the upper surface of the first frame 111. The second spacer P2 may extend on the second reflective portion 52 in a direction of the first side surface and overlap the upper surface of the first frame 111. The first and second spacers P1 and P2 may have an area of a region overlapping the first and second reflective portions 51 and 52 greater than an area of a region overlapping the first frame 111. Since the first and second spacers P1 and P2 are disposed to overlap the first frame 111 in the vertical direction or the third direction, the supporting force of the first and second spacers P1 and P2 may be strengthened. The third spacer P3 may extend on the third reflective portion 53 in a direction of the second side surface and overlap the upper surface of the second frame 113. The fourth spacer P4 may extend on the fourth reflective portion 54 in the direction of the second side surface and overlap the upper surface of the second frame 113. In the third and fourth spacers P3 and P4, an area of a region overlapping the third and fourth reflective portions 53 and 54 may be larger than an area of a region overlapping the second frame 113. Since the third and fourth spacers P3 and P4 are disposed to overlap the second frame 113 in the vertical direction or the third direction, the supporting force of the third and fourth spacers P3 and P4 may be strengthened. The distance b1 between the first and second spacers P1 and P2 may be equal to or less than the length of the first protruding portion 11 in the second direction, so that the light emitting device 120 may be supported from both sides of the first protruding portion 11. The distance b1 between the third and fourth spacers P3 and P4 may be equal to or less than the length of the fourth protruding portion 31 in the second direction, so that the light emitting device 120 may be supported from both sides of the fourth protruding portion 31. The distance b2 between the first and third spacers P1 and P3 and the distance b2 between the second and fourth spacers P2 and P4 may be smaller than the length of the light emitting device 120 in the first direction.

As shown in FIG. 6, a partially region K1 adjacent to the center of the body 115 among the spacers P1, P2, P3, and P4 may overlap the light emitting device 120 in the vertical direction. Of the spacers P1, P2, P3, and P4, the region K1 overlapping the light emitting device 120 in the vertical direction and a region K2 not overlapping the light emitting device 120 in the vertical direction may be the same width or different widths. The first to fourth spacers P1, P2, P3, and P4 may correspond to corners of the first and second bonding portions 121 and 122 under each corner of the light emitting device 120.

Each spacer P1, P2, P3, and P4 is formed of a resin material, and may suppress the spreadability of the conductive layer 333. The spacers P1, P2, P3, and P4 are disposed higher than the upper surfaces of the first and second frames 111 and 113 to space the first and second bonding portions 121 and 122 of the light emitting device 120. Each of the spacers P1, P2, P3, and P4 may protrude higher than the upper surfaces of the first and fourth protruding portions 11 and 31. The thickness b3 of each spacer P1, P2, P3, and P4 is a vertical distance from the upper surfaces of the first and second frames 111 and 113, and may be more than 30 μm, for example, in the range of 30 to 65 μm or 40 to 50 μm. When the thickness b3 of each spacer P1, P2, P3, and P4 is smaller than the above range, since the thickness of the conductive layer 333 is not uniform and is provided with a thin thickness, the electrical conduction properties or thermal conduction properties may be degraded by cracks in the conductive layer 333. When the thickness b3 of each spacer P1, P2, P3, and P4 is larger than the above range, a problem may occur in that the amount of coating of the conductive layer 333 increases and penetrates into other regions. Each of the spacers P1, P2, P3, and P4 may have the same thickness b3. Each of the spacers P1, P2, P3, and P4 may include a circular shape, a polygonal shape, an elliptical shape, or a polygonal shape with rounded corners, and may have the same shape or different shapes. The spacers P1, P2, P3, and P4 may be spaced apart from the lower portion 134 of the side surface 132 of the cavity 102.

The width of each of the spacers P1, P2, P3, and P4 may be 150 μm or more in the second direction, for example, in a range of 150 to 300 μm. The width of each spacer P1, P2, P3, and P4 in the second direction is disposed in the above range, thereby partially overlapping the lower portion of the light emitting device 120 and facing the light emitting device 120. The width (see b4, FIG. 5) of each spacer P1, P2, P3, and P4 in the first direction may be equal to or greater than the width of the second direction. This may be greater than the width b4 in the second direction for each spacer P1, P2, P3, P4 for coupling with the frame 111 and 113 in the first direction. Each spacer P1, P2, P3, and P4 further protrudes than the bottom of the cavity 102 from the bottom of the cavity 102, and is disposed higher than the lower surface of the first and second bonding portions 121 and 122.

Here, the area of the polygon shape connecting the inner surfaces of each of the spacers P1, P2, P3, and P4 in the first direction and the second direction to each other may be smaller than the area of the lower surface of the light emitting device 120. The area of the polygon shape connecting the inner surfaces of the spacers P1, P2, P3, and P4 in the first direction and the second direction to each other may be greater than the sum of the areas of the lower surfaces of the bonding portions 121 and 122 of the light emitting device 120. The area of the polygon shape connecting the outer surfaces of the spacers P1, P2, P3, and P4 in the first direction and the second direction to each other may be greater than the area of the lower surface of the light emitting device.

The light emitting device 120 may include a first bonding portion 121, a second bonding portion 122, and a light emitting structure 123. The light emitting device 120 may include a substrate 124. The light emitting device 120 may have a length in the first direction equal to or longer than the length in the second direction. The light emitting structure 123 may include a first conductivity type semiconductor layer, a second conductivity type semiconductor layer, and an active layer disposed between the first conductivity type semiconductor layer and the second conductivity type semiconductor layer. The first bonding portion 121 may be electrically connected to the first conductivity type semiconductor layer, and the second bonding portion 122 may be electrically connected to the second conductivity type semiconductor layer. The substrate 124 is a light-transmitting layer, and may be formed of an insulating material or a semiconductor material. The substrate 124 may be selected from, for example, a group including a sapphire substrate ($Al_2O_3$), SiC, GaAs, GaN, ZnO, Si, GaP, InP, and Ge. For example, an uneven pattern may be formed on the surface of the substrate 124. The light emitting structure 123 may be provided as, for example, a compound semiconductor of groups II-VI group or groups III-V. For example, the light emitting structure 123 may include at least two or more elements selected from aluminum (Al), gallium (Ga), indium (In), phosphorus (P), arsenic (As), and nitrogen (N). The first and second conductivity type semiconductor layers may be formed of, for example, a semiconductor material having a composition formula of $In_xAl_yGa_{1-x-y}N$ ($0 \le x \le 1$, $0 \le y \le 1$, $0 \le x+y \le 1$). For example, the first and second conductivity type semiconductor layers may include at least one selected from the group including GaN, AlN, AlGaN, InGaN, InN, InAlGaN, AlInN, AlGaAs, GaP, GaAs, GaAsP, AlGaInP, etc. The first conductivity type semiconductor layer may be an n-type semiconductor layer doped with an n-type dopant. The second conductivity-type semiconductor layer may be a p-type semiconductor layer doped with a p-type dopant. When the active layer is implemented with a multi-well structure, it may include a plurality of well layers and a plurality of barrier layers, and may be formed of a semiconductor material having a composition formula of $In_xAl_yGa_{1-x-y}N$ (0≤x≤1, 0≤y≤1, 0≤x+y≤1). For example, the active layer may include at least one selected from InGaN/ GaN, GaN/AlGaN, AlGaN/AlGaN, InGaN/AlGaN, InGaN/ InGaN, AlGaAs/GaAs, InGaAs/GaAs, InGaP/GaP, AlIn-GaP/InGaP, and InP/GaAs.

The light emitting device 120 may be disposed on the first and second frames 111 and 113 and the body 115. The light emitting device 120 may be disposed in the cavity 102, and the upper body 110A may be arranged around the light emitting device 120. In the cavity 102, a sub-cavity 133A is formed on an inner surface adjacent to a third side or a fourth side of the inner sides thereof, and a part of the first and second frames 111 and 113 may be exposed on the bottom of the sub-cavity 133A. The first frame 111 and the second frame 113 are exposed in the sub-cavity 113A, and a protection device 125 is disposed on one of the exposed frames, and the wire 126 may be electrically connected to another frame. A reflective resin 135 is disposed in the sub-cavity 133A, and the reflective resin 135 seals the protection device 125 and the wire 126. The reflective resin 135 is formed of a resin material such as silicone or epoxy, and may include a high refractive filler therein. The first bonding portion 121 may be disposed on the first protruding portion 11 and the second bonding portion 122 may be disposed on the fourth protruding portion 31. Each of the first and second bonding portions 121 and 122 may be electrically connected to the first and second frames 111 and 113, respectively. The first bonding portion 121 is disposed between the light emitting structure 123 and the first frame 111, and the second bonding portion 122 is disposed between the light emitting structure 123 and the second frame 113. The first and second bonding portions 121 and 122 may be include one or more material or alloys selected from the group including, for example, Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/ Au/ITO, and may be formed in a single layer or multiple layers. The light emitting device 120 may include one or a plurality of light emitting cells therein. The light emitting cell may include at least one of n-p junction, p-n junction, n-p-n junction, and p-n-p junction. The plurality of light emitting cells may be connected to each other in series within one light emitting device. Accordingly, the light emitting device may have one or a plurality of light emitting cells, and when n light emitting cells are disposed in one light emitting device, the light emitting device may be driven with a driving voltage of n times.

As shown in FIGS. 4 and 5, the first resin 160 may include an adhesive material and/or a reflective material. The first resin 160 may be disposed between the body 115 and the light emitting device 120. The first resin 160 may be disposed between the upper surface of the body 115 and the lower surface of the light emitting device 120. The first resin 160 may overlap the light emitting device 120 in the Z-axis direction, which is a vertical direction. For example, the first resin 160 may include at least one of an epoxy-based, silicone-based, and hybrid-based material including an epoxy-based and silicone-based. In addition, as an example, when the first resin 160 includes a reflection function, the first resin 160 may include white silicone.

The first resin 160 may be adhered to the light emitting device 120 and the body 115. The first resin 160 may be contacted between the first bonding portion 121 and the second bonding portion 122 of the light emitting device 120. The first resin 160 may be adhered to a region between the lower surface of the light emitting device 120 and the frames 111 and 113 and a region between the light emitting device 120 and the body 115. Accordingly, the first resin 160 may enhance the lower adhesive force and the supporting force of the light emitting device 120. When the bonding portions 121 and 122 of the light emitting device 120 is processed a bonding or bonded on a circuit board, a problem that the light emitting device 120 is tilted by the conductive layer 333 may be prevented. The first resin 160 is formed of a reflective resin material to diffuse light and improve reflection efficiency.

The first recess R1 may be provided in one or a plurality on the upper portion of the body 115. The first recess R1 may disposed on the upper portion of the body 115 disposed between the first protruding portion 11 and the fourth protruding portion 31, or may be disposed on the upper portion of the body 115 between the first frame 111 and the second frame 113. The first recess R1 may be provided concave in the direction of the lower surface from the upper surface of the body 115. The first recess R1 may be disposed in one or a plurality under the light emitting device 120. At least part or all of the first recess R1 may overlap the light emitting device 120 in the Z direction. Since the first recess R1 is disposed on the body 115, the first resin 160 may be disposed in the first recess R1. The first resin 160 may be in contact with the upper surface of the body 115, the inner portion of the first recess R1, and the lower surface of the light emitting device 120 to fix the light emitting device 120. The first resin 160 may diffuse or reflect light. The first resin 160 may include a filler such as $TiO_2$, $SiO_2$, or $Al_2O_3$ therein. The structure of the first recess R1 has an upper width wider than a lower width, and is provided as an inclined inner surface or a curved surface to guide and support the first resin 160.

Each of the frames 111 and 113 and each of the bonding portions 121 and 122 may be combined by an intermetallic compound layer. The intermetallic compound may include at least one of $Cu_xSn_y$, $Ag_xSn_y$, and $Au_xSn_y$, and x may satisfy the conditions of 0<x<1, y=1-x, x>y. The intermetallic compound layer may include a material constituting the conductive layer 333. The conductive layer 333 disposed on the first protruding portion 11 of the first frame 111 may directly contact the lower surface of the first bonding portion 121, and may be electrically connected to the first bonding portion 121. The conductive layer 333 disposed on the fourth protruding portion 31 of the second frame 113 may be in direct contact with the lower surface of the second bonding portion 122, and may be electrically connected to the second bonding portion 122. The conductive layer 333 may include one material or alloy selected from the group including Ag, Au, Pt, Sn, Cu, Zn, In, Bi, or Ti. The conductive layer 333 is a solder paste, and may be formed by mixing powder particles or particle particles with flux. The solder paste may include Sn—Ag—Cu, and the weight percentage of each metal may be different. The conductive layer 333 may include SAC (Sn—Ag—Cu) or SAC-based materials. For example, the conductive layer 333 may be formed using a conductive paste. The conductive paste may include a solder paste, a silver paste, and the like, and may be composed of a multi-layer or a single layer composed of a multi-layer or alloy composed of different materials. An intermetallic compound (IMC) layer may be formed between the conductive layer 333, the frames 111 and 113 and the bonding portions 121 and 122, in process in which the bonding portions 121 and 122 of the light emitting device 120 form the conductive layer 333 and the material constituting the conductive layer 333 or in the heat treatment process after in which the conductive layer 333 is provided. Here, an alloy layer may be formed by bonding between the material constituting the conductive layer 333 and the metals of the frames 111 and 113 or/and the bonding portions 121 and 122. Accordingly, the conductive layer 333 and the frames 111 and 113 may be physically and electrically coupled stably. The alloy layer may include at least one intermetallic compound layer selected from the group including AgSn, CuSn, AuSn, and the like. When the conductive layer 333 includes a material of at least one of Sn and Ag, and the metal layer of the bonding portion or frame includes a material of at least one of Ag, Au, Sn and Cu, the intermetallic compound layer may be formed of at least one of AgSn, AuSn, CuSn, or AgSn. The intermetallic compound layer may have a higher melting point than other bonding materials. The heat treatment process in which the metallic compound layer is formed may be performed at a lower temperature than the melting point of a common bonding material. Therefore, when the light emitting device package is bonded to the main board through a reflow process, re-melting does not occur, so that the electrical connection and physical bonding force are not deteriorated. In an embodiment, the package body may be prevented from being damaged or discolored because the package body is not exposed to high temperatures in the process of manufacturing the light emitting device package, and the selection width for the material constituting the body 115 may be widened.

The molding portion 190 may be disposed on the light emitting device 120 and the first and second frames 111 and 113. The molding portion 190 may be disposed in the cavity 102. The molding portion 190 may include an insulating material. In addition, the molding portion 190 may include a wavelength conversion means for providing wavelength-converted light. For example, the molding portion 190 may be at least one selected from the group including phosphors, quantum dots, and the like. The light emitting device 120 may emit light of blue, green, red, white, infrared, or ultraviolet light. The phosphor or the quantum dot may emit blue, green, and red light. The molding portion 190 may not be formed.

Figure 8:
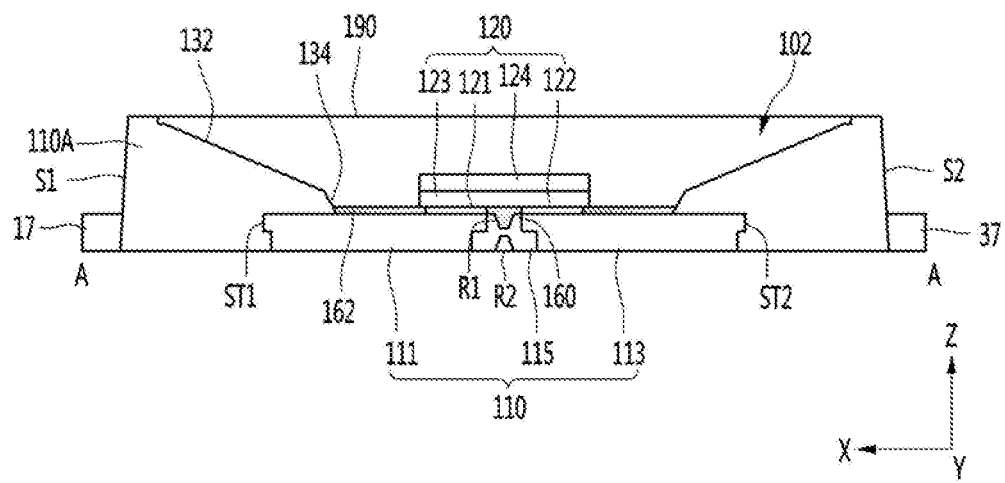
FIG. 8 is another example of the light emitting device package of FIG. 4.

As shown in FIG. 8, a second resin 162 may be disposed on the lower periphery of the light emitting device 120 or on the bottom of the cavity. The second resin 162 is disposed between the molding portion 190 and the bottom of the cavity 102, and the upper surface of the second resin 162 may be disposed equal to or lower than the lower surface of the light emitting device 120. A portion of the second resin 162 may be in contact with a side surface of the light emitting device 120, and may reflect light emitted in the lateral direction of the light emitting device 120. The second resin 162 may be in contact with each of the reflective portions 51, 52, 53, 54, the spacers P1, P2, P3, P4, and the first resin 160. When the main material of the frames 111 and 113 is copper, the coefficient of thermal expansion (CTE) of the second resin 162 is a material having a small difference from the coefficient of thermal expansion of the copper material. Accordingly, coupling holes to be described later may be disposed to reduce the area of the copper material, that is, the areas of the first and second frames 111 and 113. Due to the reduction in the area of the frame, thermal deformation due to the frame may be reduced and crack generation of the conductive layer may be suppressed.

Second Embodiment

FIGS. 10 to 14 are examples of drawings of a light emitting device package according to a second embodiment of the invention. In describing the second embodiment, the same elements as in the first embodiment will be described in the first embodiment. In the light emitting device package, the body 115 may include a first recess R1 or first and second recesses R1 and R2. In the body 115, spacers P1, P2, P3, and P4 may support the light emitting device 120 and prevent flow of the first and second bonding portions 121 and 122. The spacers P1, P2, P3, and P4 may be referred to the configuration and description of the first embodiment.

Referring to FIGS. 10 to 13, the light emitting device package may include coupling holes H5, H6, H7, and H8 in the first and second frames 111 and 113. A portion of the coupling holes H5, H6, H7, and H8 may be exposed at the bottom of the cavity 102. The upper surface area or lower surface area of the coupling holes H5, H6, H7, H8 may be larger than the upper surface area or lower surface area of the holes H1 and H2. The coupling holes H5, H6, H7, and H8 may be disposed closer to the center of the cavity 102 or to the light emitting device 120 than the holes H1 and H2 disposed outside each frame 111 and 113. The coupling holes H5, H6, H7, and H8 are disposed between the holes H1 and H2 and the protruding portions 11, 12, 13, 31, 32, and 33, the thermal deformation of each frame 111 and 113 may be alleviated.

Figure 13:
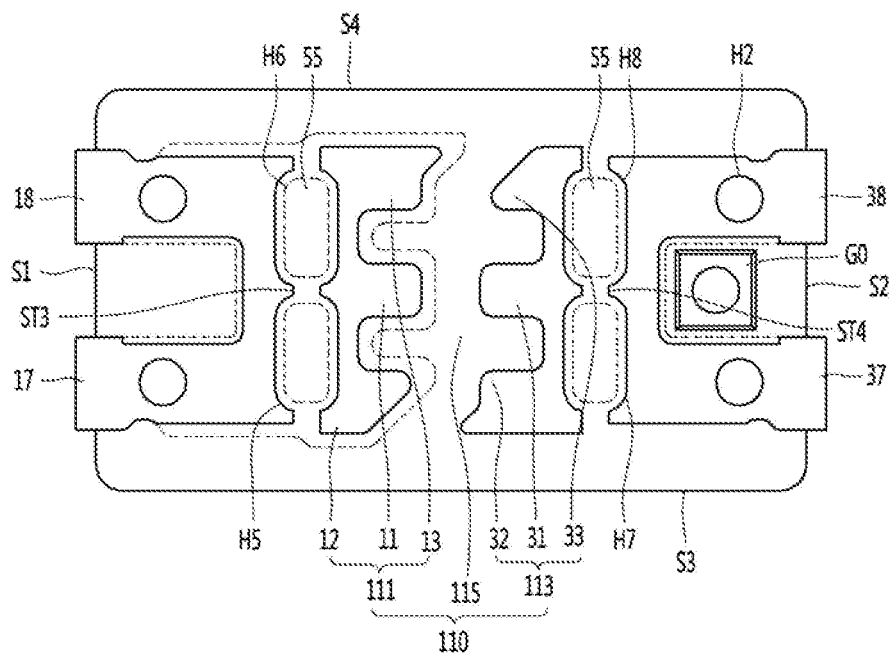
FIG. 13 is a modified example of the bottom view of the light emitting device package of FIG. 9.

As shown in FIGS. 10 and 13, the first and second coupling holes H5 and H6 disposed in the first frame 111 may have a stepped structure around the lower portion and be coupled to the body 115. The third and fourth coupling holes H7 and H8 disposed in the second frame 113 may have a stepped structure around the lower portion and be coupled to the body 115. The first and second coupling holes H5 and H6 are disposed in the second direction and may be connected to each other through the stepped structure ST3. The third and fourth coupling holes H7 and H8 are disposed in the second direction and may be connected to each other through the stepped structure ST4. The stepped structures ST3 and ST4 may be disposed to overlap the first and fourth protruding portions 11 and 31 in the first direction, thereby buffering thermal deformation applied in the first direction. A coupling portion 55 of the body 115 may be disposed in the first to fourth coupling holes H5, H6, H7, and H8, and the coupling portion 55 of the body 115 may be exposed to the outside of the short side of the light emitting device 120 and may reflect the incident light. A portion of the coupling portion 55 of the body 115 may be exposed at the bottom of the cavity 102. The coupling portion 55 of the body 115 is disposed in a region overlapping the bottom of the cavity 102 and the upper body 110A, thereby enhancing the coupling force between the body 115 and the frames 111 and 113. have. When the thermal deformation of the frames 111 and 113 occurs at the edge portion of the cavity 102, the coupling portion 55 of the body 115 may strengthen the coupling between the frames 111 and 113.

Each of the frames 111 and 113 has coupling holes H5, H6, H7, and H8 arranged in the second direction, and may alleviate the impact transmitted in the first direction by the coupling holes H5, H6, H7, and H8. The coupling holes H5, H6, H7, and H8 are coupled to the coupling holes 55 of the body 115, so as to alleviate the impact transmitted in the first direction. Therefore, the coupling portion 55 of the body 115 disposed inside the coupling hole H5, H6, H7, H8 relieves each of the frames 111 and 113 that expand in the first direction from the bottom of the light emitting device and may be suppress the occurrence of cracks in the conductive layer located below the light emitting device due to the thermal deformation of the frames 111 and 113 in the first direction. To this end, when the coupling holes H5, H6, H7, and H8 are provided in a region adjacent to the light emitting device 120 with a predetermined area or more, it is possible to relieve the thermal expansion of the frame 111 and 113 itself, by the coupling portion 55 the body 115 disposed in the coupling holes H5, H6, H7, and H8.

Figure 14:
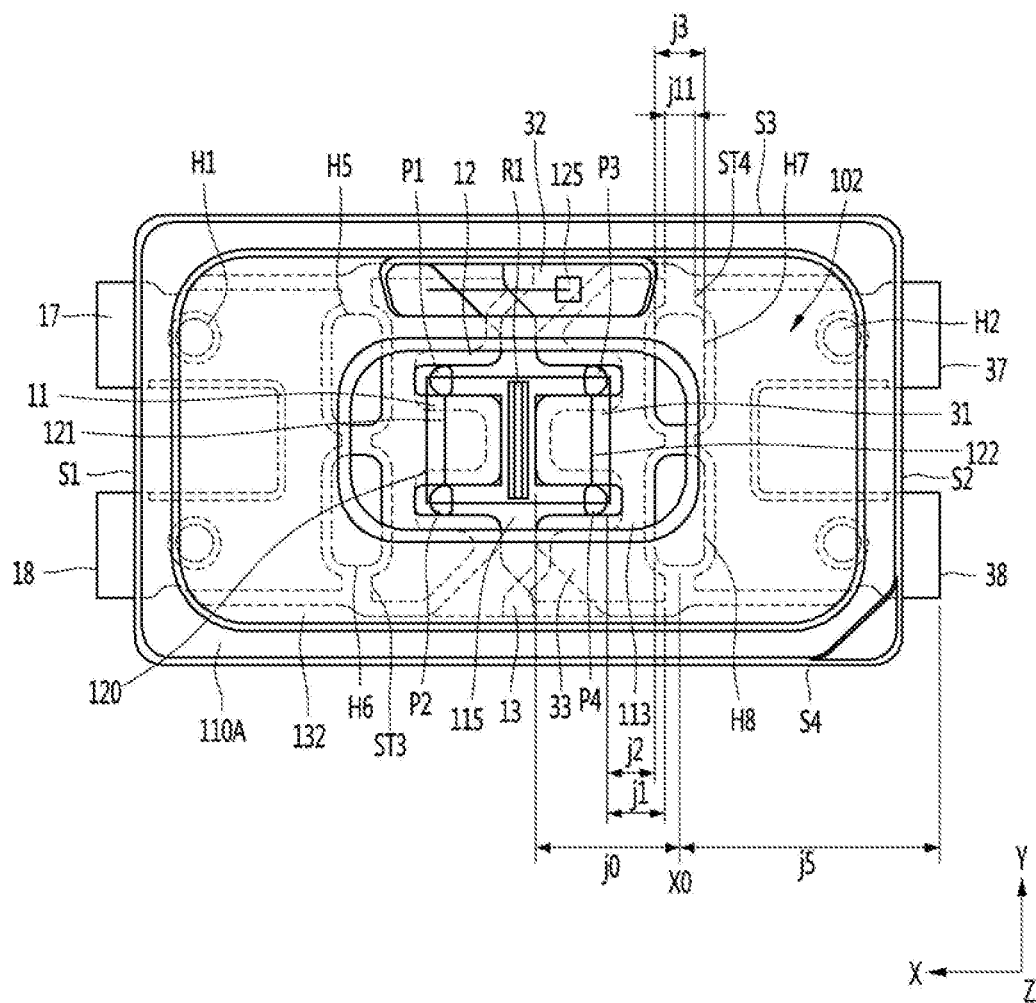
FIG. 14 is a view for explaining a coupling hole in the light emitting device package of FIG. 10.
Figure 15:
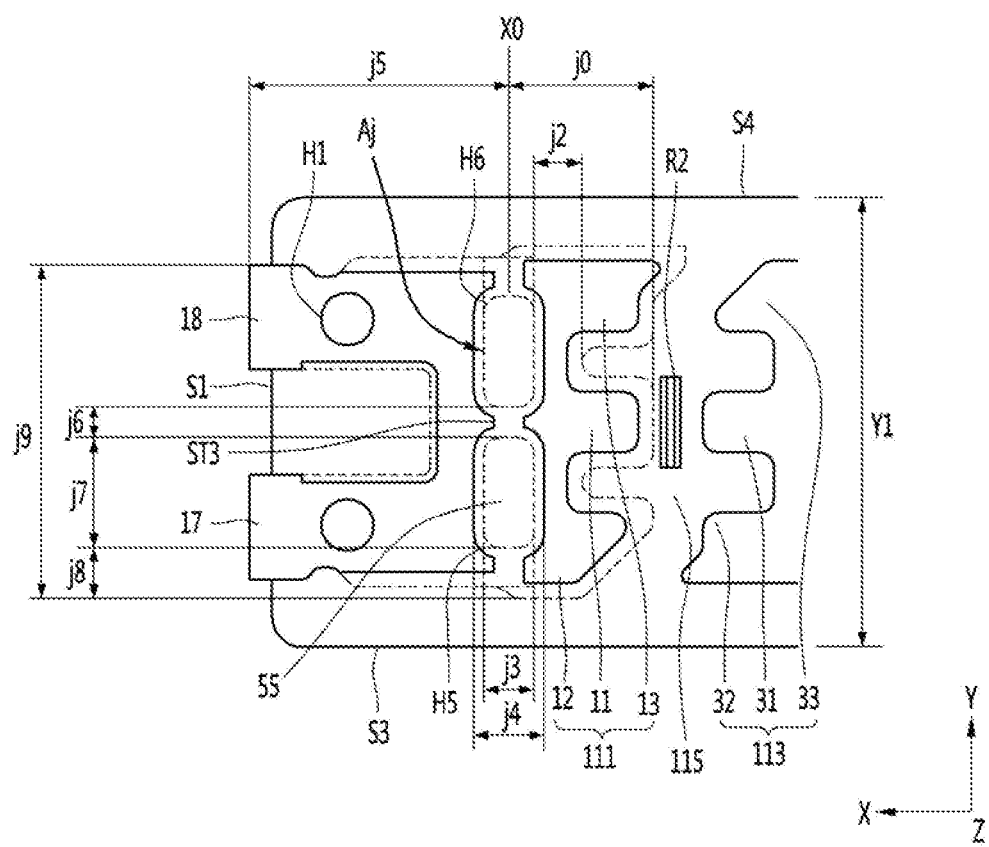
FIG. 15 is a bottom view of the light emitting device package of FIG. 14 and is a view illustrating a relationship between a coupling hole and a frame.

Referring to FIGS. 14 and 15, the first and second coupling holes H5 and H6 in the first frame 111 are spaced apart in the second direction, and the upper surface width j7 in the second direction may be greater than an upper surface width j3 in the first direction. The region between the first and second coupling holes H5 and H6 is a coupling portion 55 that plays a role to conduct heat transferred to the first frame 111 through the light emitting device 120 in the first side direction, and supports the first and second coupling holes H5 and H6. The upper surface width j6 of the coupling portion 55 between the first and second coupling holes H5 and H6 may be in the range of 0.18 mm or more, for example, 0.18 mm to 0.25 mm. When the upper surface width j6 of the coupling portion 55 is smaller than the above range, the stiffness may be lowered, and when it is larger than the above range, the relaxation suppression effect due to thermal deformation may be reduced. The distance j8 between the outer edges of the frame from the upper surface of each of the coupling holes H5, H6, H7, and H8 may be 0.3 mm or more, for example, in the range of 0.3 mm to 0.42 mm, thereby preventing stiffness deterioration. Here, since the third and fourth coupling holes H7 and H8 are the same as the descriptions of the first and second coupling holes H5 and H6, this will be referred to.

The heat conductive portion between adjacent coupling holes H5, H6, H7, and H8 may have a distance j1 between the spacers P1, P2, P3, and P4 from the heat conductive portion may be 0.28 mm or more, for example, in a range of 0.28 to 0.38 mm. Here, the width j2 between the upper surface of each of the coupling holes H5, H6, H7, H8 and the spacers P1, P2, P3, P4 may be smaller than the width j1, thereby stably providing the width of the coupling hole. With respect to the center axis X0 of the coupling holes H5, H6, H7, and H8, the distance j0 to the inner end of each frame 111, 113 in the first direction may be equal to or narrower than the distance j5 to the outer end. The central axis X0 of the coupling holes H5, H6, H7, and H8 is the center of the upper surface width j3 in the first direction, and the inner ends of each frame 111 and 113 are an inner ends of first and fourth protruding portions 11 and 31, and the outer end may be an outer side of the extension portions 17, 18, 37, and 38. Here, the ratio relationship of j0:j5 may have a relationship of 1: x (x≥1), for example, j0 may be 1.4 mm or less, or may range from 0.8 mm to 1.4 mm. When the distance j0 is smaller than the above range, the heat dissipation efficiency may be lowered or the distance between the coupling holes H5, H6, H7, and H8 and the reflecting portions 51, 52, 53, and 54 may be narrowed, resulting in a decrease in rigidity, when it is larger than the above range, the relief effect at the time of thermal expansion of the frames 111 and 113 may be insignificant.

Showing at the area in the second direction of each of the coupling holes H5, H6, H7, and H8, the width j3 in the first direction may be 0.25 mm or more, for example, 0.25 mm to 0.3 mm, and the width j7 of the second direction The width j7 may range from 0.5 mm or more, for example, from 0.5 mm to 0.8 mm. The width j3 in the first direction of the coupling holes H5, H6, H7, and H8 may be 0.09 to 0.1 times or less the length of the first direction of the frames 111 and 113. The width j7 in the second direction of the coupling holes H5, H6, H7, and H8 may range from 0.2 to 0.32 times the length j9 in the second direction of the frames 111 and 113. The length of the first direction of the frames 111 and 113 is a straight-line length between the extension portion of each frame 111 and 113 and the center-side protrusion portions, and the length j9 in the second direction may be the maximum length in the second direction. The lengths of the first and second directions of the frames 111 and 113 may be values obtained by measuring the lengths of the upper surfaces. When the thickness T2 of the frames 111 and 113 is in the range of 0.1 mm to 0.3 mm, the sum of the areas in the second direction of the coupling holes H5, H6, H7 and H8 arranged in each frame 111 and 113 may be 90% or less, for example, in a range of 10% to 90%, or 40% to 65%. Accordingly, since each of the frames 111 and 113 has the above-described area in the second direction, thermal expansion of the frames 111 and 113 in the first direction may be alleviated and a decrease in heat dissipation efficiency may be prevented. At least one or two coupling holes H5, H6, H7, and H8 for the thermal expansion may be disposed in each frame 111 and 113 in the second direction. When the area in the second direction of the coupling holes H5, H6, H7, and H8 is smaller than the above range, it may be insignificant to alleviate thermal expansion of the frames 111 and 113 in the first direction, and when it is greater than the above range, stiffness and heat dissipation efficiency may be reduced.

The width in the second direction of the lower surface of each of the coupling holes H5, H6, H7, and H8 may be wider than the width j7 of the upper surface, and may range from 0.42 mm or more, for example, from 0.42 mm to 0.55 mm. Each of these coupling holes H5, H6, H7, and H8 has stepped structures ST3 and ST4 at the lower portion of the thereof, so that the widths of the lower surface may be wider than the widths of the upper surface in the first and second directions. Since the lower surface of the first and second coupling holes H5 and H6 and the lower surface of the third and fourth coupling holes H7 and H8 are arranged to be opened by the stepped structures ST3 and ST4 in the second direction, the coupling portion 55 of the body 115 may extend in the second direction along the lower surface of the first to fourth coupling holes H5, H6, H7, and H8. The minimum width j11 of the lower surface of the coupling holes H5, H6, H7, and H8 is the width in the first direction of the extended region, and may be 0.2 mm or more and 50% or less of the lower surface j4. The region between the plurality of coupling holes H5, H6, H7, and H8 and the outer region of each coupling hole may be provided with a thickness thinner than the thickness of the first and fourth protruding portions 11 and 13 of the frames 111 and 113.

The coupling holes H5, H6, H7, and H8 may absorb or alleviate the thermal deformation of each frame 111 and 113 at a region Aj between the first and second side surfaces S1 and S2 of the body 115 and the region where the light emitting device 120 is disposed on each frame 111 and 113, and minimize the thermal deformation of each frame 111 and 113, thereby suppressing the occurrence of cracks in the conductive layer at the bottom of the cavity.

A support portion may be disposed under the side surface of the cavity 102 along the second direction of the body 115. The support portion may be disposed on both sides in the second direction of the first recess R1. The support portion may further increase the thickness of the body 115 at the boundary portion between the bottom and a lower portion 134 of the side of the cavity 102, thereby enhancing the breaking strength of the body 115.

Figure 16:
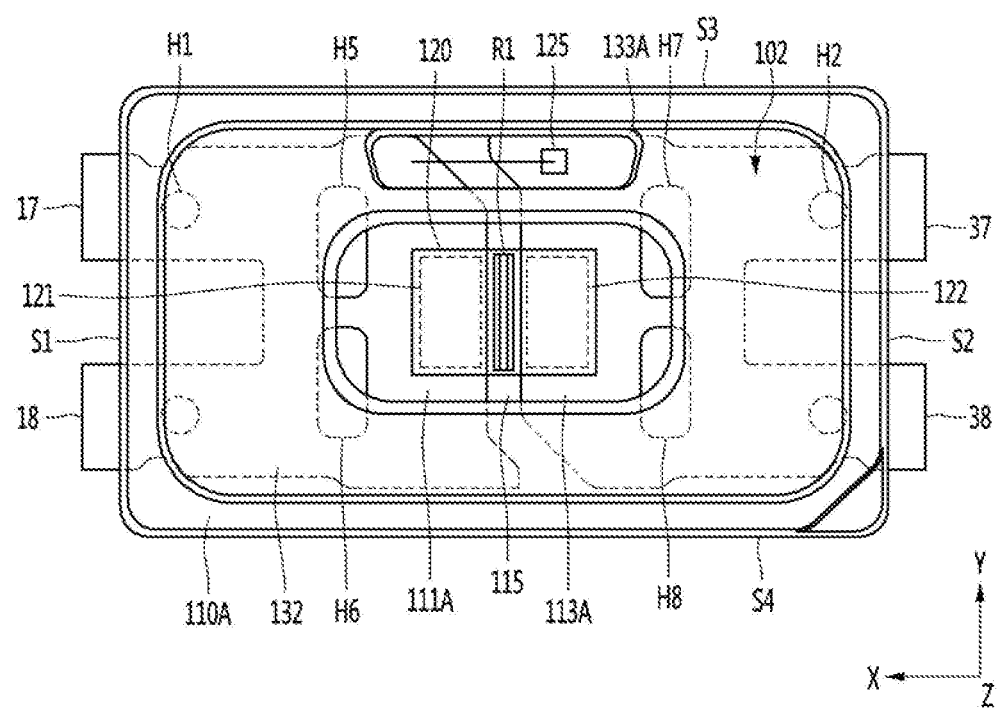
FIG. 16 is a first modified example of the light emitting device package of FIG. 14.

FIG. 16 is a first modified example of the light emitting device package of FIG. 14. Referring to FIG. 16, the first and second frames 111 and 113 have a structure provided without a protruding portion, and have a first recess R1 at the upper portion and a plurality of coupling holes H5, H6, H7, and H8. In the third modification, the first recess R1 of the body 115 disposed between the first and second frames 111 and 113 and the plurality of coupling holes H5, H6, H7, and H8 overlapping the upper body 110A in the vertical direction may be used to alleviate thermal deformation in the package. Further, the light emitting device package may be provided without the spacer disclosed in the embodiment.

Third Embodiment

FIGS. 17 to 28 are views of a light emitting device package according to a third embodiment. In describing the third embodiment, the same elements as the above-described configuration refer to the above description, and the overlapped configuration may be selectively applied.

Referring to FIGS. 17 to 27, the first to fourth spacers P1, P2, P3, and P4 may space apart the light emitting device 120 from the upper surface of the frames 111 and 113 on the lower corner portions of the light emitting device 120, so that the thickness of the conductive layer 333 may be secured. The spacers P1, P2, P3, and P4 may have a top view shape in a circular shape or a polygonal shape, or a curved shape having some corner portions. The spacers P1, P2, P3, and P4 may overlap the reflective portions 51, 52, 53, and 54 of the body 115 in the vertical direction. The spacers P1, P2, P3, and P4 may be disposed to overlap the reflective portions 51, 52, 53, and 54 of the body 115 and the frames 111, 113 in the vertical direction, as in the first and second embodiments. The spacers P1, P2, P3, and P4 may function as a locking protrusion or a movement preventing protrusion of the bonding portions 121 and 122, or may function as a locking protrusion or a movement preventing protrusion of the light emitting device 120. The spacers P1, P2, P3, and P4 may have a diameter or a width that is the same as or different from the width of the upper surface in the second direction of the reflective portions 51, 52, 53, and 54.

Figure 25:
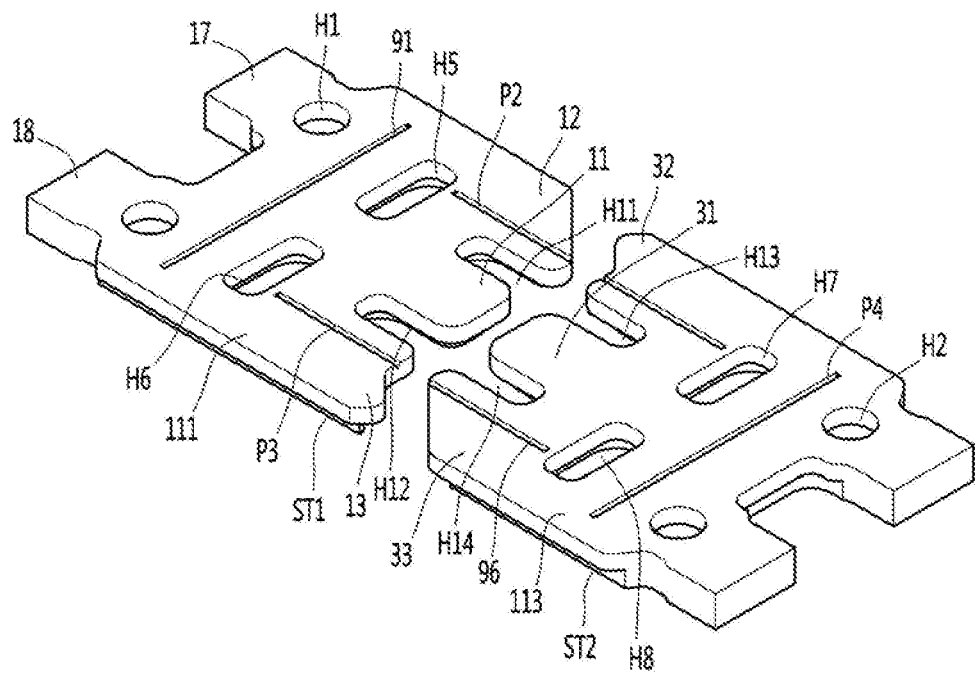
FIG. 25 is a perspective view showing an example of a frame of the light emitting device package of FIG. 14.
Figure 26:
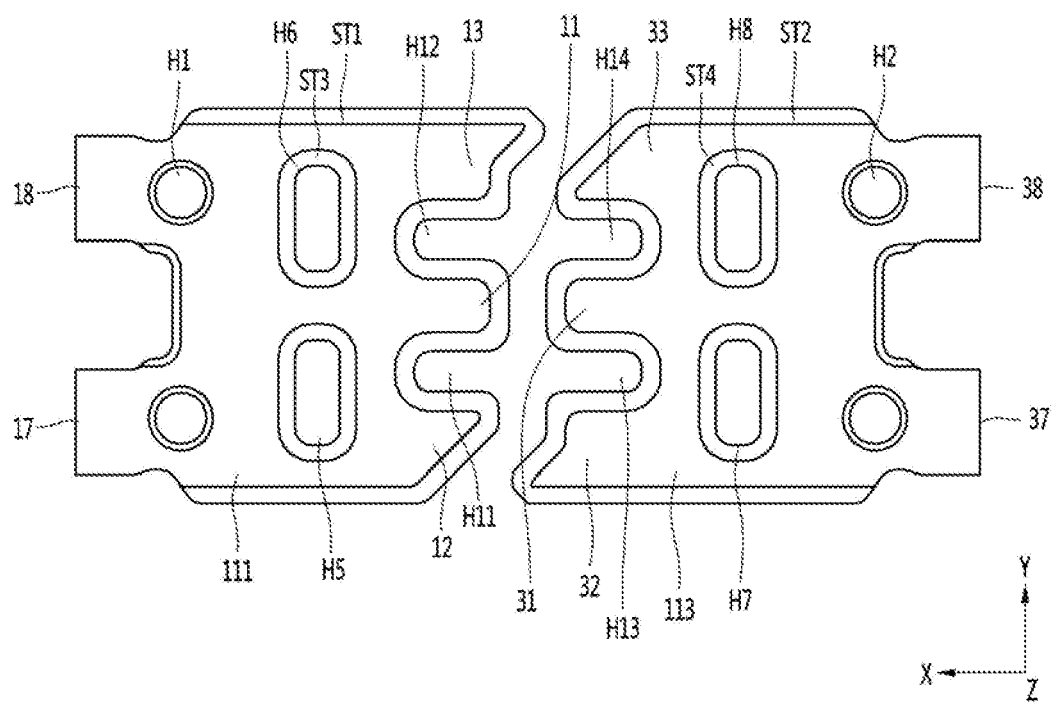
FIG. 26 is a bottom view of the frame of FIG. 17.

Referring to FIGS. 16, 17, 25, and 26, the lower portions of the holes H1 and H2 and the coupling holes H5, H6, H7, and H8 of each frame 111 and 113 may have stepped structures ST3 and ST4. The areas of the upper surfaces of each hole H1, H2 and the coupling holes H5, H6, H7, and H8 may be smaller than the areas of the lower surfaces thereof. As shown in FIGS. 25 and 26, the concave portions H11 and H12 of the first frame 111 to which the first and second reflective portions 51 and 52 of the body 115 are coupled may be disposed concave in the direction of the first extending portions 17 and 18. The concave portions H13 and H14 of the second frame 113 to which the third and fourth reflective portions 51 and 52 of the body 115 are coupled may be disposed concave in the direction of the second extending portions 37 and 38. Each of the concave portions H11, H12, H13, and H14 may be provided in a curved shape, for example, a hemispherical shape or a semi-elliptical shape. Since the concave portions H11, H12, H13, and H14 have a curved shape, the contact area with the body 115 may be increased. The contact areas between the protruding portions 11, 12, 13, 31, 32, and 33 of the frames 111 and 113 and the reflective portions 51, 52, 53, and 54 are increased, and a path of moisture penetration may be lengthened. The stepped structures ST1, ST2, ST3, and ST4 may have a depth of 100 μm or more, for example, in a range of 100 to 130 μm. The depth of the stepped structures ST1 and ST2 of each of the protruding portions 11, 12, 13, 31, 32 and 33 may be greater than the depth of the stepped structures ST3 and ST4 of the respective coupling holes H5, H6, H7 and H8, so that the penetration of moisture into the bottom of the cavity may be suppressed. The upper surfaces of the coupling holes H5, H6, H7, and H8 may not be exposed to the bottom of the cavity, and thus the moisture penetration path may be blocked through the coupling holes H5, H6, H7 and H8. Ribs 107 and 108 may be disposed on the outer surface of the long side in the outer sides of the body 115 or the side surfaces S3 and S4 in the second direction. The ribs 107 and 108 may support the long side of the body 115. The ribs 107 and 108 protrude outwardly below the side surfaces S3 and S4 of the body 115, and may be provided with a length longer than the length of the first direction of the bottom of the cavity 105. The ribs 107 and 108 may support the center region of the body having a long length in one direction.

Figure 19:
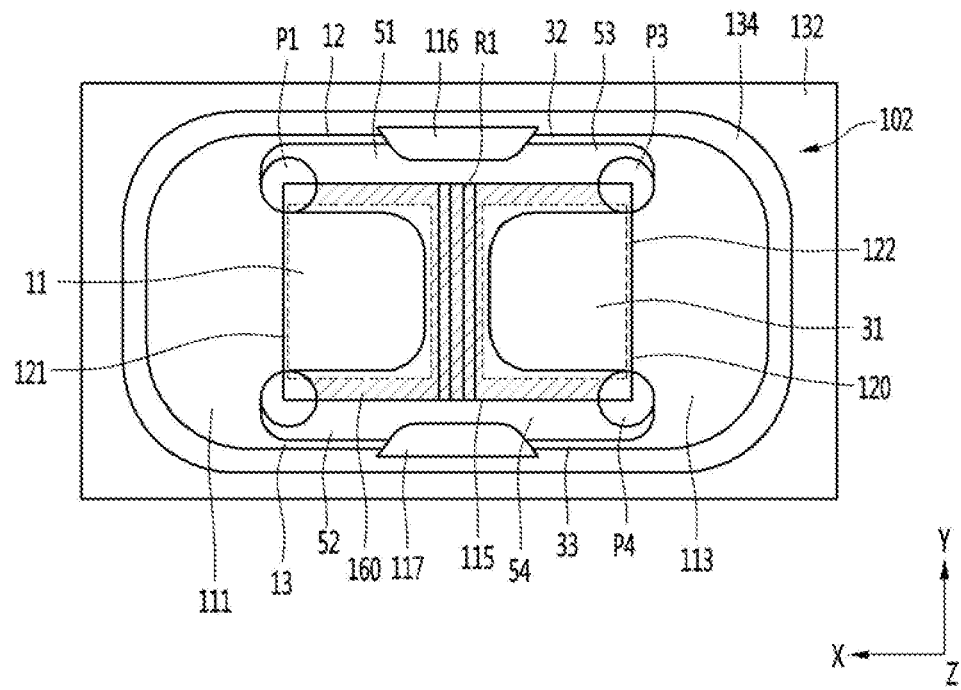
FIG. 19 is a view for explaining a region in which the first resin is disposed in the light emitting device package of FIG. 17.

As shown in FIG. 19, the plurality of support portions 116 and 117 are disposed along the second direction of the body 115, and may be disposed on both ends of the first recess R1 or on both sides of the second direction. The plurality of support portions 116 and 117 are structures protruding on the body 115, and may be connected to a lower portion 134 of the sides of the cavity 102. Reference will be made to the above-described description of the plurality of support portions 116 and 117.

Figure 17:
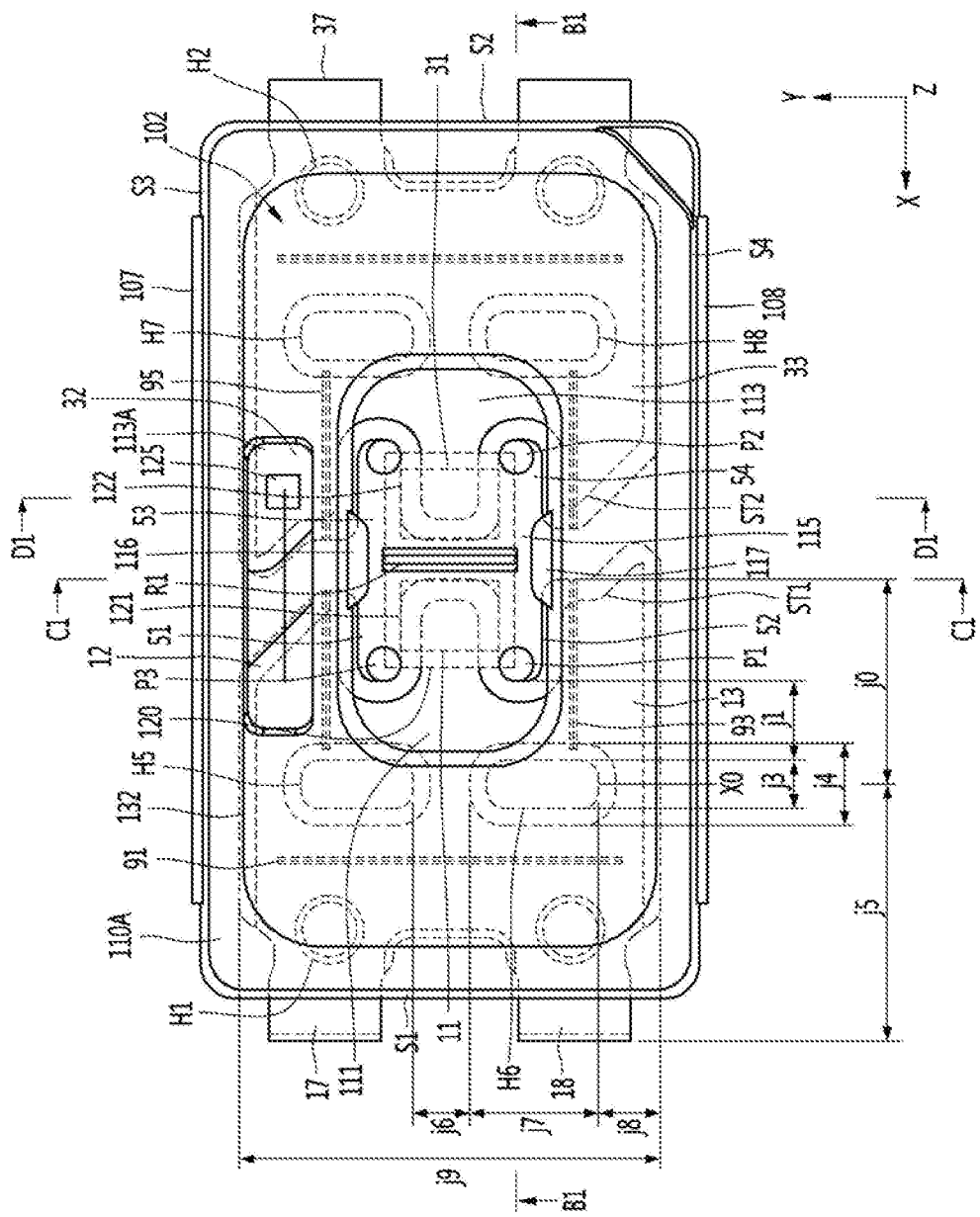
FIG. 17 is a plan view of a light emitting device package according to a third embodiment.
Figure 18:
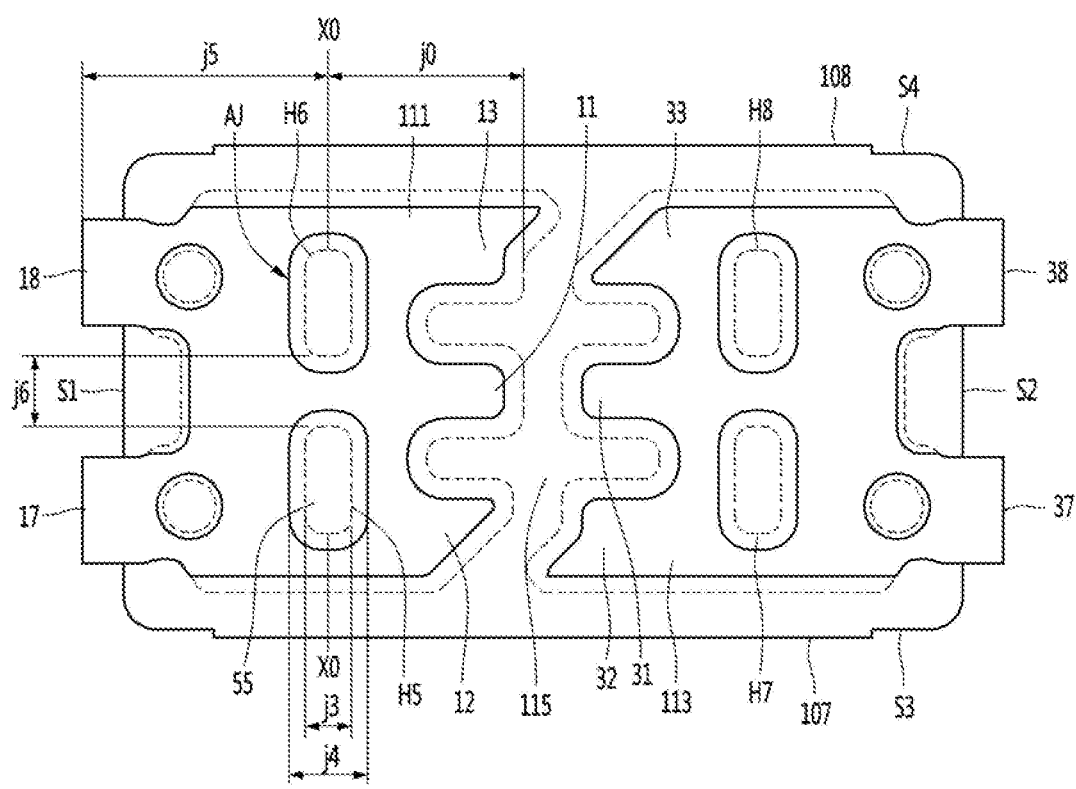
FIG. 18 is a bottom view of the light emitting device package of FIG. 17.

The first recess R1 may alleviate the impact transmitted to the body by the frame deformation between the frames 111 and 113, and the coupling holes H5, H6, H7, and H8 may relieve shock or thermal expansion transmitted toward the first direction. Referring to FIGS. 17 and 18, the first and second coupling holes H5 and H6 in the first frame 111 and third and fourth coupling holes H7 and H8 in the second frame 111 may be spaced apart from the upper surface and the lower surface in the second direction with a predetermined distance j6. The upper surface width j7 in the second direction in each coupling hole H5, H6, H7, and H8 may be greater than the upper surface width j3 in the first direction, and may be greater than the width of the first and fourth protruding portions 11 and 31 in the second direction. The region between the first and second coupling holes H5 and H6 and the region between the third and fourth coupling holes H7 and H8 are heat conductive portions contacting the coupling portion 55 and the light emitting device 120, may thermally conduct heat transferred to the first frame 111 and the second frame 113 through the light emitting device 120 in the directions of the first and second side surfaces, and may support the first and second coupling holes H5 and H6 and the third and the fourth coupling holes H3 and H4. The distance j6 of the upper surfaces of the heat conductive portion between the first and second coupling holes H5 and H6 may be 0.18 mm or more, for example, in the range of 0.18 mm to 0.25 mm. When the distance j6 of the upper surfaces of the heat conductive portion is smaller than the above range, the stiffness may be lowered, and when it is larger than the above range, the relaxation suppression effect due to thermal deformation may be reduced. The distance j8 between the outer edges of the frame and the upper surface of each of the coupling holes H5, H6, H7, H8 may be 0.3 mm or more, for example, in the range of 0.3 mm to 0.42 mm, thereby preventing stiffness deterioration. Here, the description of the third and fourth coupling holes H7 and H8 are the same as the description of the first and second coupling holes H5 and H6, and may be referred to the description of the first and second coupling holes H5 and H6. The description of the coupling holes H5, H6, H7, H8 may be referred to the description disclosed above. Since the lower surfaces of the first and second coupling holes H5 and H6 and the lower surfaces of the third and fourth coupling holes H7 and H8 are spaced apart in the second direction, each of the frames 111 and 113 may be disposed around the first to fourth coupling hole H5, H6, H7, and H8. The coupling holes H5, H6, H7, and H8 in each of the frames 111 and 113 may absorb or mitigate the thermal deformation of the frames 111 and 113 in the region Aj between the region where the light emitting devices 120 are disposed and between the first and second side surfaces S1 and S2, and suppress the occurrence of cracks in the conductive layer at the bottom of the cavity.

Referring to FIGS. 19 to 22, the light emitting device 120 corresponds to the body 115 and the first and second frames 111 and 113, and then the first resin 160 dispenses on the body 115, and the conductive layer 333 is disposed on the first and fourth protruding portions 11 and 31 of the first and second frames 111 and 113. Thereafter, the light emitting device 120 is disposed on the first and second frames 111 and 113, and the light emitting device 120 compresses the first resin 160 as shown in FIG. 19, and the first resin 160 may adhered between the light emitting device 120 and the body 115. The first resin 160 and the spacers P1, P2, P3, and P4 may be described with reference to the first embodiment.

Figure 20:
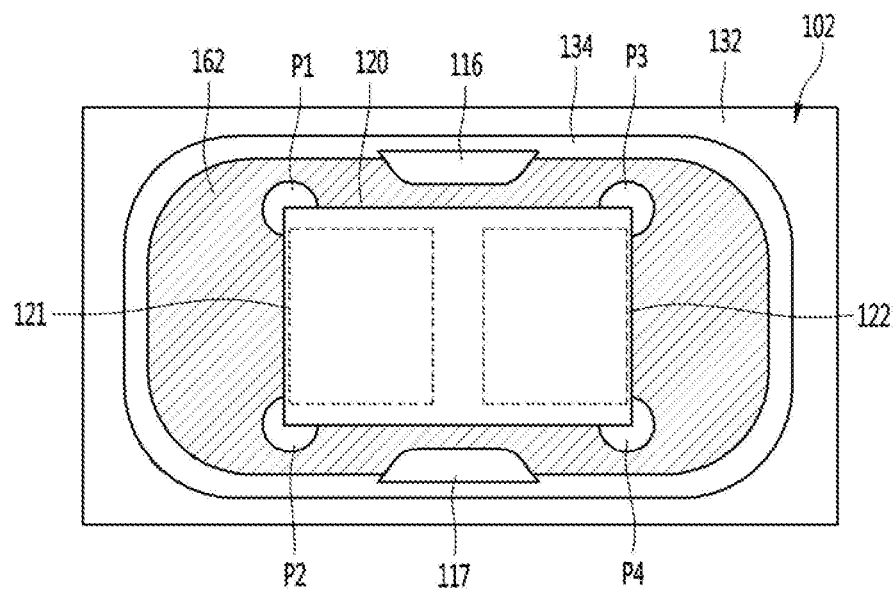
FIG. 20 is a view showing an example in which the first and second resins are disposed in the light emitting device package of FIG. 17.
Figure 27:
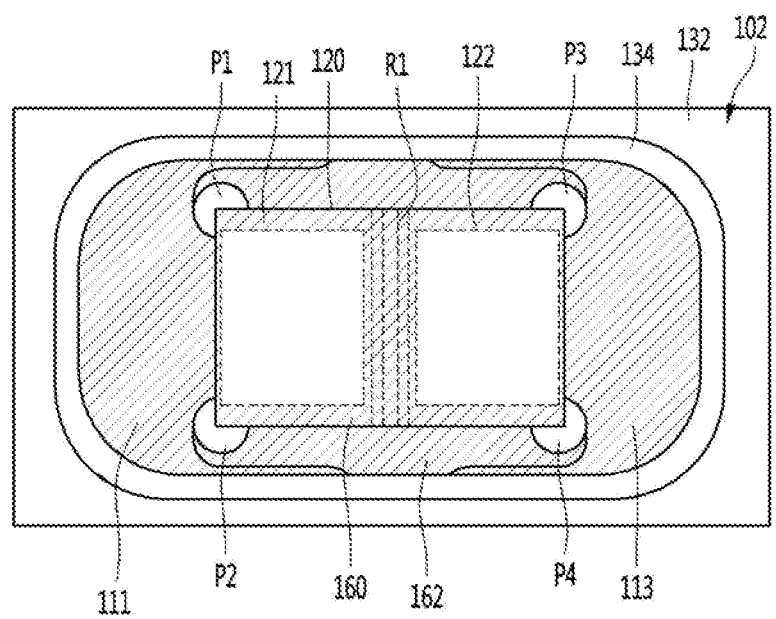
FIG. 27 is a view for showing regions of the first and second resins in the light emitting device package of FIG. 17.
Figure 28:
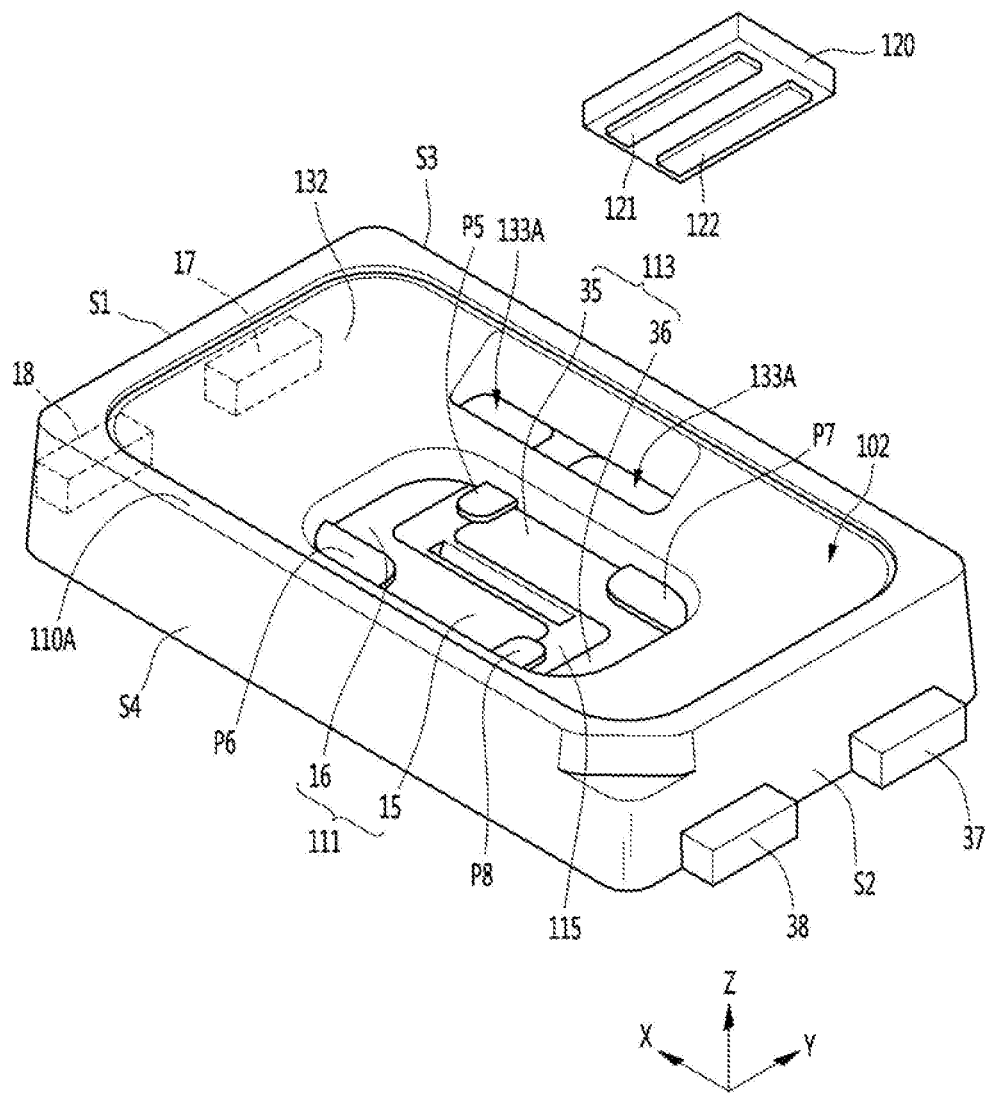
FIG. 28 is an exploded perspective view of a light emitting device package according to a fourth embodiment.
Figure 29:
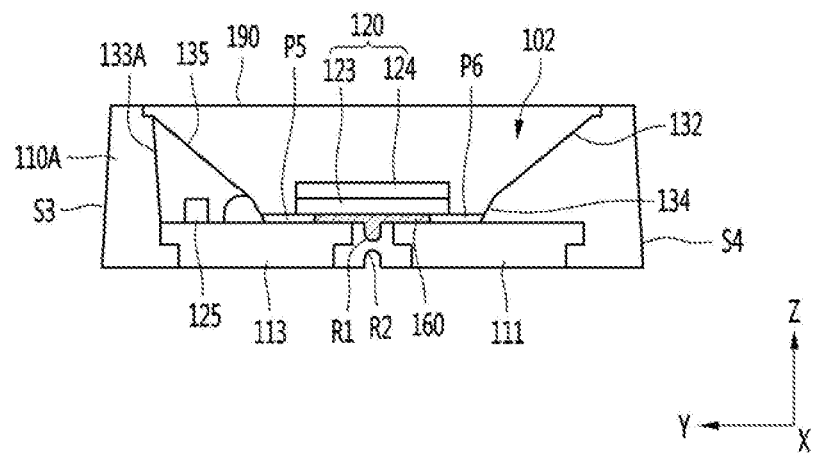
FIG. 29 is a cross-sectional side view of the light emitting device package of FIG. 28.
Figure 30:
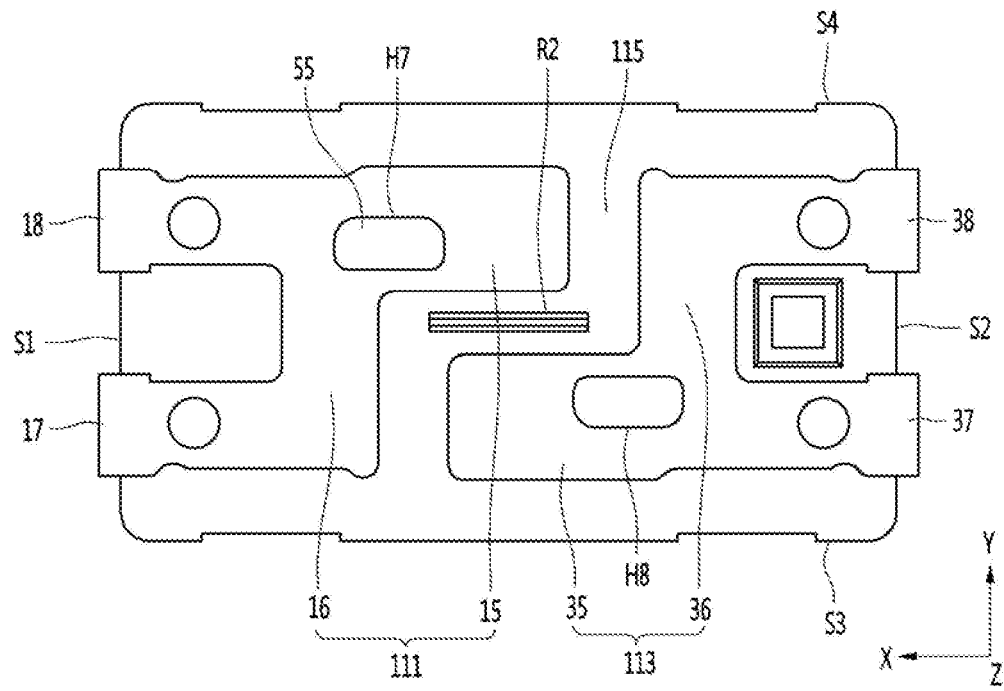
FIG. 30 is an example of a bottom view of the light emitting device package of FIG. 28.
Figure 31:
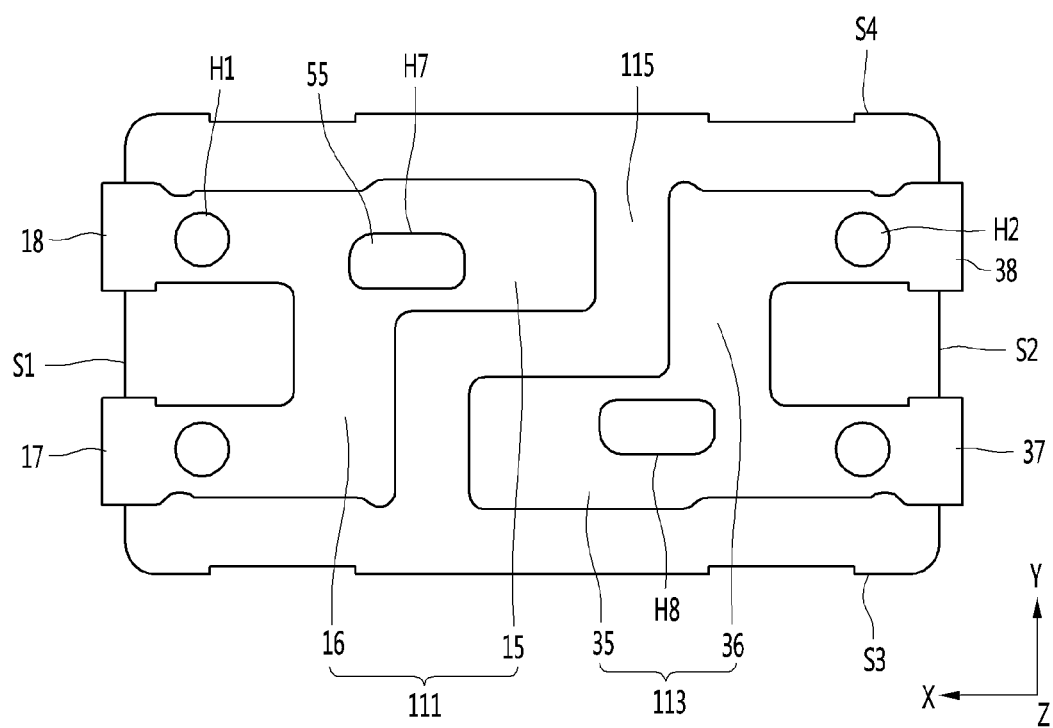
FIG. 31 is another example of the bottom view of the light emitting device package of FIG. 28.

Since the spacers P1, P2, P3, and P4 are disposed at a lower corner of the light emitting device 120, space or thickness of the conductive layer 333 may be provided. As shown in FIG. 21, the second resin 162 may have a thickness Ta smaller than a thickness of the spacers P1, P2, P3 and P4 on the body 115, the reflective portions 51, 52, 53, and 54, and the first and second frames 111 and 113. The upper surface of the second resin 152 may have a height lower than the thickness of the spacers P1, P2, P3, and P4 and lower than a height Tb of the lower surface of the light emitting device 120. Here, as shown in FIGS. 20, 21, and 27, the first and second resins 161 and 162 may be disposed around the first and second bonding portions 121 and 122 of the light emitting device 120. Since the conductive layer 333 does not deviate from the lower region of the light emitting device 120, electrical reliability of the light emitting device 120 may be improved and crack generation of the conductive layer 333 may be suppressed. As illustrated in FIG. 21, the upper portion 162A of the second resin 162 may be disposed on a lower portion of the side of the light emitting device 120. The upper portion 162A of the second resin 162 may extend along the lower portion of the sides of the light emitting device 120 by capillary action and contact the lower portion of the sides of the light emitting device 120. The upper portion 162A of the second resin 162 may be disposed higher than the height Tb of the lower surface of the light emitting device 120. The outer region of the second resin 162 may contact the lower portion of the sides of the cavity 102 at a higher height than other regions. The second resin 162 may include a filler, a metal oxide, or a high refractive material in a transparent resin. The second resin 162 may include a filler, for example, TiO2, SiO2, or Al2O3. When the process of accelerating the precipitation phenomenon for the fillers added to the second resin 162 is performed, the fillers added to the second resin 162 may precipitate toward the bottom. Here, the process of accelerating the precipitation phenomenon may include a process of accelerating by using a centrifugal separator. For example, as shown in FIG. 21, the filler 162B added in the second resin 162 precipitates toward the frame, and the upper portion 162A of the second resin 162 remains as a region without the filler 162B. When there is no filler 162B in the upper portion 162A of the second resin 162, light emitted through the side surface of the light emitting device 120 or the side surface of the active layer may be transmitted or refracted through the upper portion 162A of the second resin 162. The upper portion 162A of the second resin 162 may be in contact along the side surfaces of the light emitting device 120, for example, the side surface of the light emitting structure 123. The upper portion 162A of the second resin 162 is provided as the filler-free region, thereby reducing light loss on the side surface of the light emitting structure 123.

As shown in FIGS. 20 and 27, the second resin 162 may be disposed on the bottom of the cavity 102. When viewed from the top view, the top surface of the spacers P1, P2, P3, and P4, the upper surfaces of the support portions 116 and 117, and the upper surface of the light emitting device 120 may be exposed from the second resin 162. The second resin 162 has a coefficient of thermal expansion similar to that of the main material of the frames 111 and 113, thereby reducing deformation due to thermal expansion.

As shown in FIGS. 17 and 25, each of the frames 111 and 113 may include a plurality of notches 91, 92, 93, 94, 95 and 96. The plurality of notches 91, 92, 93, 94, 95, and 96 are disposed on the upper portion of each frame 111 and 113, may be concave grooves toward a lower surface from the upper surface of each frame 111 and 113, and may have the side cross-sectional shape with a polygonal shape such as a triangle or a square, or a curved shape such as a hemispherical shape or a semi-elliptical shape. The notch 91, 92, 93, 94, 95, and 96 may have a depth of 50 μm or less, for example, in the range of 10 to 50 μm or in the range of 25 to 35 μm. When the depth of the notches 91, 92, 93, 94, 95, and 96 is greater than the above range, the rigidity of the frame having a stepped structure may be lowered, and when it is smaller than the above range, the moisture penetration suppression effect may be lowered. The notch 91, 92, 93, 94, 95, and 96 may increase the contact area with the upper body, so that the penetration of moisture may be suppressed.

The notches 91, 92 and 93 disposed on the upper portion of the first frame 111 include a first notch 91 disposed in a second direction longer than a second direction length of the bottom of the cavity, and second and third notch 92 and 93 disposed on both sides of the cavity in the direction. The first notch 91 may be disposed outside the first and second coupling holes H5 and H6 and may have a length longer than the sum of the lengths of the first and second coupling holes H5 and H6 in the second direction. The second notch 92 may be disposed long in the first direction in the second protruding portion 12 of the first frame 111. Both ends of the second notch 92 may be disposed to overlap the stepped structure of the first coupling hole H5 and the second protruding portion 12 in the vertical direction. Since the second notch 92 may be disposed on the stepped structure of the first coupling hole H5 and the second protruding portion 12, the penetration of moisture flowing through the first coupling hole H5 and the second protruding portion 12 may suppress. The third notch 93 may be disposed to be elongated in the first direction in the third protruding portion 13 of the first frame 111, and both ends of the third notch 93 may be vertically overlapped with the second coupling hole H6 and the stepped structure of the third protruding portion 13. The third notch 93 may suppress moisture inflow through the second coupling hole H6 and the outside of the third protruding portion 13. The second and third notches 92 and 93 are disposed parallel to each other, and may be arranged in a direction orthogonal to the first notch 91. The first, second, and third notches 91, 92, and 93 are disposed toward the first side surface S1, the third side surface S3, and the fourth side surface S4 based on the first frame 111 disposed on the bottom of the cavity, and may suppress the penetration of moisture.

The notches 94, 95, and 96 disposed on the upper portion of the second frame 113 include a fourth notch 94 disposed longer than the second direction length of the bottom of the cavity in the second direction, and fifth and sixth notches 95 and 96 disposed on both sides of the cavity in the first direction. The fourth notch 94 is disposed outside the third and fourth coupling holes H7 and H8 and may have a length longer than the sum of the lengths in the second direction of the third and fourth coupling holes H7 and H8. The fifth notch 95 may be disposed long in the first direction in the fifth protruding portion 32 of the second frame 113. Both ends of the fifth notch 95 may be disposed to overlap the stepped structure of the third coupling hole H7 and the fifth protruding portion 32 in a vertical direction. The fourth, fifth, and sixth notches 94, 95, and 96 are disposed toward the second side surface S2, the third side surface S3, and the fourth side surface S4 based on the second frame 113 disposed on the bottom of the cavity 102, and may suppress the penetration of moisture.

Fourth Embodiment

FIGS. 28 to 31 are examples of light emitting device packages according to a fourth embodiment of the invention. In describing the fourth embodiment, the same configuration as that described above may be selectively applied.

Referring to FIGS. 28 to 31, the light emitting device package includes a plurality of spacers P5, P6, P7, and P8 on the outer edge regions of the light emitting device 120 and first and second frames 111 and 113 spaced apart in the first direction. On the upper surface of the body or the bottom of the cavity, the first frame 111 includes a first protruding portion 15 having a long length in the first direction and a second protruding portion 16 having a long length in the second direction, and the second frame 113 may include a third protruding portion 35 having a long length in the first direction and a fourth protruding portion 36 having a long length in the second direction. The first protruding portion 15 may face the fourth protruding portion 36 in the first direction and face the third protruding portion 35 in the second direction. The second protruding portion 16 may face the third protruding portion 35 in the first direction. The body 115 may be disposed along the first and second protruding portions 15 and 16 and the third and fourth protruding portions 35 and 36. The body 115 may include a first recess R1 having a long length in a first direction between the first and second frames 111 and 113.

The first and second bonding portions 121 and 122 of the light emitting device 120 may be spaced apart in the second direction. The length direction or the first direction of the first recess R1 may be a direction orthogonal to the second direction in which the first and second bonding portions 121 and 122 are arranged. The first and second bonding portions 121 and 122 may be disposed to have lengths longer than the lengths of the second direction in the first direction, so as to face the first protruding portions 15 and the third protruding portions 35. Since the first protruding portion 15 and the third protruding portion 35 overlap with the first and second bonding portions 121 and 122 in the vertical direction and are spaced apart in the second direction, the light emitting device 120 may have a long length in the first direction and may have a short length in the second direction.

The first spacer P8 protrudes from the body 115 disposed between the second protruding portion 16 and the third protruding portion 35 and may extend onto the third protruding portion 35. The second spacer P6 is disposed on the region of the first frame 111, is disposed between the first and second protruding portions 15 and 16, and may be contacted to the lower portion of the sides of the cavity 102. The second spacer P6 may face the first spacer P5 in a second direction and may be spaced apart from the body region between the first and second frames 111 and 113. The second spacer P6 may face the fourth spacer P8 in the first direction. The third spacer P7 is disposed on the region of the second frame 113, is disposed between the third and fourth protruding portions 35 and 36, and may be contacted to the lower portion of the sides of the cavity 102. The third spacer P7 may face the first spacer P5 in a first direction and may be spaced apart from the region of the body between the first and second frames 111 and 113. The third spacer P7 may face the fourth spacer P8 in the second direction. The fourth spacer P8 protrudes from the body 115 disposed between the first protruding portion 15 and the fourth protruding portion 36 and may extend onto the first protruding portion 15.

The body 115 may include a center region where the first recess R1 is disposed, a first reflective portion extended in the direction of the third side surface from an end the center region where the first recess R1 is disposed and connected to the first spacer P5, and a second reflective portion extended in the direction of the fourth side surface from the end of the center region where the first recess R1 is disposed and connected to the fourth spacer P8. At least partially portion of each spacer P5, P6, P7, and P8 may be overlapped with the first and second frames 111 and 113 in the vertical direction, the support force may be enhanced. Each spacer P5, P6, P7, and P8 may be coupled or contacted to the lower portion of the sides of the cavity 102, the support force may be enhanced. Here, holes H5 and H8 may be provided in portions of the first and second frames 111 and 113 where the second and third spacers P6 and P7 are disposed. Each spacer P5, P6, P7, and P8 protrudes to higher height than the upper surface of the body 115 and may be provided with a predetermined thickness b3 from the upper surfaces of the first and second frames 111 and 113. The light emitting device 120 may be spaced apart by the thickness b3 of each of the spacers P5, P6, P7, and P8, and between the first and second bonding portions 121 and 122 and the frames 111 and 113. By reducing the spread of the conductive layer, crack generation of the conductive layer may be suppressed. Each of the spacers P5, P6, P7, and P8, and the first and second resins will be referred to the description of the above-described embodiment. The body 115 may be provided with a first recess R1 at the upper portion thereof and a second recess R2 at the lower portion thereof or without the second recess. The length of the first recess R1 in the first direction may be the same as or greater than the length b5 of the first recess R2 in the first direction. The distance a5 between the first and third spacers P5 and P7 may be smaller than the length of the first recess R1 in the first direction. The distance a5 between the first and third spacers P5 and P7 may be smaller than the first direction length b5 of the second recess R2. The length of the first recess R1 in the first direction may be longer than the length of the first and second bonding portions 121 and 122 in the first direction, thereby alleviating thermal deformation. Here, the first and second resins will be referred to the description of the first embodiment. The first resin 160 may be formed of a thermally conductive material that dissipates heat downward as well as an adhesive function. In this case, the content of the metal oxide added to the first resin 160 may be increased to be disposed.

An embodiment of the invention may improve the thermal shock properties in the light emitting device package by the recess of the body. In addition, cracking of the conductive layer such as solder may be suppressed by improving thermal shock characteristics. The spacer disposed on the body or the frame spaces the light emitting devices from the upper surfaces of the body and the frame, so that the thickness of the conductive layer such as solder may be secured or adjusted, preventing tilt of the light emitting device and preventing crack the conductive layer, and the underfill process of the first resin may be easy. According to an exemplary embodiment of the invention, the reflective portions are disposed outside the first and second frames of the light emitting device package to automatically align the light emitting device when the it may be re-melted, thereby minimizing the region deviation of the light emitting device. Each of the above-described embodiments may be applied in combination or modification with configurations of other embodiments. One or more light emitting device packages according to the embodiment(s) of the invention may be disposed on a circuit board and applied to a light source device. Further, the light source device may include a display device, a lighting device, an indicator device, a vehicle lamp, a head lamp, and the like, depending on the industrial field.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a first frame and a second frame spaced apart from each other;
a body disposed between the first frame and the second frame; and
a light emitting device disposed on the first frame and the second frame,
wherein the first frame includes a first end portion adjacent to the second frame,
wherein the second frame includes a second end portion adjacent to the first frame and facing the first end portion,
wherein the first end portion includes a first protruding portion protruding toward the second frame,
wherein the second end portion includes a second protruding portion protruding toward the first frame,
wherein the light emitting device package includes a first bonding portion disposed on the first protruding portion and a second bonding portion disposed on the second protruding portion,
wherein the light emitting device is disposed on an upper surface of the first protruding portion and an upper surface of the second protruding portion
wherein a lower surface of the first protruding portion and a lower surface of the second protruding portion are exposed to a lower surface of the body,
wherein the body disposed between the first frame and the second includes a first recess overlapping the light emitting device in a vertical direction, and
wherein an upper width of the first recess is greater than a lower width of the first recess.

2. The light emitting device package of claim 1, wherein the first end portion of the first frame includes third and fourth protruding portions spaced apart from both sides of the first protruding portion and protruding in a direction of the second frame,
wherein the second end portion of the second frame includes fifth and sixth protruding portions spaced apart from both sides of the second protruding portion and protruding in a direction of the first frame, and
wherein the body includes a first reflective portion disposed between the first and third protruding portions, a second reflective portion disposed between the first and fourth protruding portions, a third reflective portion disposed between the second and fifth protruding portions, and a fourth reflective portion disposed between the second and sixth protruding portions.

3. The light emitting device package of claim 1, further comprising a second recess disposed on an opposite side of the first recess on a lower portion of the body,
wherein the first and second recesses overlap in the vertical direction, and
wherein a lower width of the second recess is greater than an upper width of the second recess.

4. The light emitting device package of claim 1, further comprising a first resin adhered under the light emitting device, and a second resin adhered around a lower portion of the light emitting device and disposed around the first and second bonding portions,
wherein each of the first and second frames includes a plurality of holes disposed outside, and a portion of the body is coupled to the plurality of holes.

5. The light emitting device package of claim 4, further comprising a conductive layer disposed between the first and second bonding portions and between the first and second frames,
wherein the first and second resins are disposed around the conductive layer disposed under the first and second bonding portions.

6. The light emitting device package of claim 4, wherein each of the first and second frames includes a coupling hole between the plurality of holes and the first and second protruding portions, and
wherein the coupling holes are disposed in a direction orthogonal to the direction in which the first and second frames are disposed, and each of the coupling holes has a width wider than a width of each of the first and second protruding portions.

7. The light emitting device package of claim 6, wherein the coupling hole has a stepped structure having a thickness smaller than that of the first and second protruding portions.

8. The light emitting device package of claim 4, further comprising a plurality of spacers disposed around a lower surface of the light emitting device,
wherein the plurality of spacers is spaced apart the first and second bonding portions of the light emitting device from upper surfaces of the first and second frames, upper surfaces of the plurality of spacers protrude higher than lower surfaces of the first and second bonding portions, and wherein the plurality of spacers is disposed on both sides of the first and second protruding portions and protruded from the body.

9. The light emitting device package of claim 1, further comprising first and second support portions disposed between the first and second frames, having a wider width than a width of the light emitting device, and protruding from the body,
wherein a depth of the first recess is in a range of 50% to 80% of a thickness of the first and second frames.

10. A light emitting device package comprising:
a first frame and a second frame spaced apart from each other;
a body disposed between the first frame and the second frame; and
a light emitting device disposed on the first frame and the second frame,
wherein the first frame includes a first end portion adjacent to the second frame,
wherein the second frame includes a second end portion adjacent to the first frame and facing the first end portion,
wherein the first end portion includes a plurality of protruding portions protruding toward the second frame,
wherein the second end portion includes a plurality of protruding portions protruding toward the first frame,
wherein the plurality of first protruding portions of the first end portion includes a first protruding portion protruding toward one of the plurality of protruding portions of the second end portion,
wherein the plurality of first protruding portions of the second end portions includes a second protruding portion protruding toward of the plurality of protruding portions of the first end portion,
wherein the light emitting device package includes a first bonding portion disposed on the first protruding portion and a second bonding portion disposed on the second protruding portion,
wherein the light emitting device is disposed on an upper surface of the first protruding portion and an upper surface of the second protruding portion,
wherein a lower surface of the first protruding portion, a lower surface of the second protruding portion and a lower surface of the body are exposed to a lower surface of the light emitting device package,
wherein the body disposed between the first frame and the second includes a first recess overlapping the light emitting device in a vertical direction, and
wherein an upper width of the first recess is greater than a lower width of the first recess.

11. The light emitting device package of claim 10, wherein
the first recess is disposed under a region between the first and second bonding portions, and
wherein the first recess is disposed between the first and second protruding portions.

12. The light emitting device package of claim 11, further comprising an upper body disposed on the first frame, the second frame and the body, and having a cavity,
wherein the light emitting device is disposed in the cavity,
wherein the first protruding portion and the second protruding portion face in a first direction, and
wherein the body extends in a second direction orthogonal to the first direction between the first protruding portion and the second protruding portion.

13. The light emitting device package of claim 12, wherein each of the first and second protruding portions has a length smaller than a length of the light emitting device in the first direction, and
wherein a width of the first protruding portion in the second direction is less than the length of the light emitting device.

14. The light emitting device package of claim 10, wherein the first end portion of the first frame includes third and fourth protruding portions spaced apart from both sides of the first protruding portion and protruding in a same direction as the first protruding portion, and
wherein the second end portion of the second frame includes fifth and sixth protruding portions spaced apart from both sides of the second protruding portion and protruding in a same direction as the second protruding portion.

15. The light emitting device package of claim 14, wherein the body includes a first reflective portion extend to a region between the first and third protruding portions, a second reflective portion extend to a region between the first and fourth protruding portions, a third reflective portion extend to a region between the second and fifth protruding portions, and a fourth reflective portion extend to a region between the second and sixth protruding portions.

16. The light emitting device package of claim 15, wherein the first and second protruding portions and the first to fourth reflective portions overlap the light emitting device in the vertical direction.

17. The light emitting device package of claim 15, further comprising a resin adhered to a lower surface and a periphery of lower portion of the light emitting device and disposed around the first and second bonding portions,
wherein the first and second reflective portions extend parallel to each other, and
wherein the third and fourth reflective portions extend parallel to each other.

18. A light emitting device package comprising:
a first frame having a plurality of protruding portions;
a second frame having a plurality of protruding portions; and
a body disposed between the first frame and the second frame
wherein the light emitting device is disposed on one of the plurality of protruding portions of the first frame and the plurality of protruding portions of the second frame,
wherein each of the plurality of protruding portions of the first frame is opposed to each of the plurality of protruding portions of the second frame,
wherein the body includes a plurality of reflective portions extending into regions between the plurality of protruding portions of the first frame and regions between the plurality of protruding portions of the second frame,
wherein the plurality of reflective portions includes a plurality of spacers protruding toward an upper surface of the light emitting device,
wherein the plurality of reflective portions protrudes higher than a height of upper surfaces of the first and second frames,
wherein the body disposed between the first frame and the second includes a recess overlapping the light emitting device in a vertical direction, and wherein an upper width of the recess is greater than a lower width of the recess.

19. The light emitting device package of claim 18, wherein a resin is disposed in the recess,
   wherein the first and second frames are formed of a metal material,
   wherein lower surfaces of the first and second frames are exposed to lower surface of the body,
   wherein the light emitting device includes a first bonding portion disposed on the first protruding portion, and a second bonding portion disposed on the second protruding portion, and
   wherein the light emitting device overlaps with the plurality of reflective portions of the body in the vertical direction.

* * * * *